(12) United States Patent
Kasumi

(10) Patent No.: US 7,218,382 B2
(45) Date of Patent: May 15, 2007

(54) LOAD-LOCK TECHNIQUE

(75) Inventor: Kazuyuki Kasumi, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 208 days.

(21) Appl. No.: 10/999,137

(22) Filed: Nov. 30, 2004

(65) Prior Publication Data

US 2005/0186716 A1 Aug. 25, 2005

(30) Foreign Application Priority Data

Dec. 2, 2003 (JP) ............................. 2003-402488

(51) Int. Cl.
*G03B 27/58* (2006.01)
(52) U.S. Cl. .......................................... 355/72; 355/75
(58) Field of Classification Search .................. 355/72, 355/75
See application file for complete search history.

(56) References Cited

U.S. PATENT DOCUMENTS

| | | | |
|---|---|---|---|
| 5,572,563 A | 11/1996 | Kasumi et al. ............... | 378/34 |
| 5,835,560 A | 11/1998 | Amemiya et al. ............ | 378/34 |
| 6,714,277 B2 | 3/2004 | Hara et al. ..................... | 355/30 |
| 6,750,946 B2 | 6/2004 | Tanaka et al. ................. | 355/30 |
| 6,754,303 B2 | 6/2004 | Kasumi ........................ | 378/34 |
| 2002/0002946 A1 | 1/2002 | Tanaka et al. ............. | 118/719 |
| 2003/0015290 A1 | 1/2003 | Edo ....................... | 156/345.27 |
| 2003/0021671 A1 | 1/2003 | Edo ........................... | 414/939 |
| 2004/0004701 A1 | 1/2004 | Kasumi ....................... | 355/53 |
| 2004/0013497 A1* | 1/2004 | Shirai .......................... | 414/217 |
| 2004/0257550 A1 | 12/2004 | Kasumi ....................... | 355/53 |

FOREIGN PATENT DOCUMENTS

| | | |
|---|---|---|
| JP | 2001-102281 | 4/2001 |
| JP | 2003-31639 | 1/2003 |
| JP | 2003-45947 | 2/2003 |
| JP | 2003-133388 | 5/2003 |

OTHER PUBLICATIONS

Chinese Office Action dated Apr. 14, 2006, issued in corresponding Chinese patent application No. 200410094209.5, with English translation.9.

* cited by examiner

*Primary Examiner*—D. Rutledge
(74) *Attorney, Agent, or Firm*—Fitzpatrick, Cella, Harper & Scinto

(57) ABSTRACT

A load-lock system which includes a chamber housing and a capacity changing system for continuously changing the capacity of the chamber housing.

18 Claims, 33 Drawing Sheets

OPEN CADDY
COVER AND LOAD WAFER

WAFER ELEVATING MEANS
MOVES UP TO LIFT WAFER
FROM HAND

RETRACT HAND

WAFER ELEVATING
MEANS MOVES DOWN

CLOSE CADDY COVER
TO COMPLETE WAFER
STORAGE

OPEN GATE VALVE
TO LOAD CADDY

CADDY LOADED

HAND MOVES DOWN

RETRACT HAND

HAND RETRACTION COMPLETED AND CLOSE GATE VALVE

BEFORE WAFER
LOADING

OPEN GATE VALVE, THEN
MOVE CADDY, AND THEN
OPEN CADDY COVER

HAND (WAFER) MOVES
INTO, THEN ELEVATING
MECHANISM MOVES UP,
AND THEN WAFER IS
LIFTED

② ELEVATING MECH-
ANISM MOVES UP
③ LIFT WAFER

HAND RETRACTED

ELEVATING MECHANISM
MOVES DOWN AND
CADDY COVER CLOSED

② CADDY COVER
CLOSED

① ELEVATING MECH-
ANISM MOVES
DOWN

CADDY MOVES, THEN
GATE VALVE IS CLOSED,
AND THEN AMBIENCE
IS REPLACED

VARIABLE LOAD-LOCK CAPACITY

CLOSE GATE VALVE AND
AMBIENCE REPLACEMENT

OPEN GATE VALVE

VARIABLE LOAD-LOCK CAPACITY

WAFER UNLOADING

VARIABLE LOAD-LOCK CAPACITY

CLOSE GATE VALVE
AND AMBIENCE REPLACEMENT
(VACUUM EXHAUSTING)

AMBIENCE REPLACEMENT
(GAS SUPPLY)
PLUS VARIABLE CAPACITY

OPEN GATE VALVE

WAFER UNLOADING

LOAD-LOCK TECHNIQUE

FIELD OF THE INVENTION AND RELATED ART

This invention relates to a load-lock technique applicable to the production of various microdevices such as, for example, semiconductor chips (e.g., ICs or LSIs), display devices (e.g., liquid crystal panels), detecting elements (e.g., magnetic heads), and image pickup devices (e.g., CCDs).

The density and speed of a semiconductor integrated circuit have been improved significantly and, with this trend, the linewidth of an integrated circuit pattern has been narrowed more and more. This forces further improvements in the semiconductor manufacturing method. As regards exposure apparatuses used for forming a resist pattern in a lithographic process, which is one of semiconductor manufacturing processes, those using deep ultraviolet light, such as KrF laser light (wavelength 248 nm), ArF laser light (wavelength 193 nm) or $F_2$ laser light (wavelength 157 nm) have been developed. Currently, EUV exposure apparatuses, which use extreme ultraviolet light (EUV light) having a wavelength of about 10 nm, are being developed. Exposure apparatuses using an electron beam are being developed, on the other hand.

If the wavelength is short, such as EUV light, X-rays or an electron beam, the exposure light is attenuated in the atmosphere. In consideration of this, to avoid attenuation of exposure light, the exposure process is carried out in a vacuum ambience or a reduced pressure He ambience.

In process machines, such as a sputtering apparatus, carrying out a process in a vacuum ambience is common. Loading and unloading a substrate to be processed, from the atmosphere into a process chamber (vacuum ambience), is carried out by way of a load-lock chamber (housing).

In exposure apparatuses as well, load-lock chambers are used when a substrate to be exposed is loaded into a vacuum ambience (exposure ambience).

Referring now to FIG. 7, the structure of a known type of load-lock system will be explained. Load-lock chamber (housing) 101 is provided at a side of a main chamber 102 in which an exposure process is to be carried out. There is an atmosphere side gate valve 104 at one side of the load-lock chamber 101, and a vacuum side gate valve 103 at the other side of the load-lock chamber. For evacuation to create a vacuum level in the chamber, there are an exhaust pipe 105, an exhaust valve 106 and a vacuum pump 107. Furthermore, for resuming an atmospheric pressure inside the chamber from the vacuum level, there are a gas supplying pipe 108 and a gas supplying valve 109.

For loading a substrate 110 from the atmosphere into the main chamber 102, which is in a vacuum state, the vacuum side gate valve 103, the exhaust valve 106 and the gas supply valve 109 are kept closed and, on the other hand, the atmosphere side gate valve 104 is opened. Then, the substrate 110 is introduced into the chamber. Subsequently, the atmosphere side gate valve 104 is closed, and the exhaust valve 106 is opened. Normally, the vacuum pump 107 is kept driven uninterruptedly. As regards the exhaust valve 106, generally, a butterfly valve is used. By opening the exhaust valve 106, the atmospheric gas inside the load-lock chamber 101 is discharged outwardly. After the exhausting is completed, the exhaust valve 106 is closed and the vacuum side gate valve 103 is opened, and the substrate is introduced into the main chamber 102. After the substrate is loaded, the vacuum side gate valve 103 is closed.

For unloading a processed substrate out of the main chamber 102, the load-lock chamber 101 is exhausted and placed in a vacuum state (all the valves and gate valves are kept closed), and thereafter, the vacuum side gate valve 103 is opened. Then, the substrate 110 is unloaded and moved back into the load-lock chamber 110. After this, the vacuum side gate valve 103 is closed and, subsequently, the gas supply valve 109 is opened. The gas supply pipe 108 is communicated with the atmosphere, such that, by opening the gas supply valve 109, the inside of the load-lock chamber 101 can be filled with atmosphere. After an atmospheric pressure is reached, the atmosphere side gate valve 104 is opened, and the substrate 110 is moved outwardly.

With the procedure described above, it is assured that a substrate 110 is conveyed between the atmosphere and the main chamber 102 without damaging the vacuum state inside the main chamber 102.

In exposure apparatuses, such as an X-ray exposure apparatus wherein the exposure is carried out in a reduced pressure He ambience, for loading a substrate 110 into the main chamber 102, after the vacuum evacuation the load-lock chamber 101 is filled with the He gas of a pressure similar to that of the main chamber 102, subsequently, the vacuum side gate valve 103 is opened and the substrate 110 is loaded.

Japanese Laid-Open Patent Applications, Publication Nos. 2001-102281, 2003-031639, and 2003-045947, disclose examples of load-lock chambers that can be applied to a semiconductor exposure apparatus, or the like.

However, in the load-lock chamber structure such as described above, when the gas is exhausted to create a vacuum level in place of the atmospheric pressure state, at that moment, the exhaust valve is opened the atmospheric air inside the chamber is exhausted rapidly. This causes adiabatic expansion of the air and, thus, the temperature decreases suddenly. As a result of this, the moisture content contained in the atmosphere is frozen and adhered to the substrate surface, causing contamination of it. Simultaneously, since heat is carried away from the substrate, the temperature of the substrate is lowered. If the load-lock operation and operations following it are carried out while the substrate temperature is low, the substrate temperature gradually rises in accordance with the surrounding temperature. Such a temperature rise is a serious factor for slowing down the production yield, particularly in a process (such as a lithographic process) wherein precise temperature control is required.

Generally, the inconveniences described above can be avoided by carrying out the vacuum exhausting slowly to provide a sufficient time for transmission of heat between the air and the surrounding ambience. Load-lock systems are incorporated into process machines, such as a film forming apparatus and, in such machines, the time required for the process itself is relatively long. Thus, there is a margin with respect to time that can be spent on substrate loading and unloading by load-locking. Even if the vacuum exhausting takes time, it does not affect the throughput of the apparatus.

Among exposure apparatuses, those that are arranged to carry out the exposure process in a vacuum have already been used in practice, such as an electron beam direct drawing apparatus, for example. Such apparatus have a very low throughput by nature, and the time necessary for loading and unloading a substrate by load-locking does not raise a problem. However, EUV exposure apparatuses, and the like, are machines designed for mass production of MPUs or memories, for example, and a very high throughput on an order of 100 pieces per hour is required. If the load-lock structure is arranged for slow exhausting, although the inconveniences such as substrate contamination or temperature decrease could be avoided thereby, a very long time for substrate loading and unloading is required. This is a serious factor for throughput decrease of the apparatus. Practically, therefore, the load-lock structure such as described above cannot be applied to a machine, such as an EUV exposure apparatus, in which a large throughput is required.

SUMMARY OF THE INVENTION

It is accordingly an object of the present invention to provide a load-lock technique by which high-speed vacuum exhausting is enabled, while reducing or suppressing contamination or temperature decrease of an object to be loaded and/or unloaded.

In accordance with an aspect of the present invention, there is provided a load-lock system, comprising a chamber housing, and a capacity changing system for changing the capacity of the chamber housing.

In accordance with another aspect of the present invention, there is provided a load-lock method, comprising the steps of conveying an object into a chamber housing, reducing the capacity of the chamber housing after the conveying step, and reducing the pressure inside the chamber housing after the capacity reducing step.

Briefly, in accordance with the present invention, a load-lock technique by which high-speed pressure reduction is enabled, while suppressing contamination or temperature decrease of an object to be loaded and/or unloaded, can be provided.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of load-lock systems according to the present invention, specifically, embodiments wherein the invention is applied to an exposure apparatus, will now be described with reference to the attached drawings.

Embodiment 1

Figure 1:
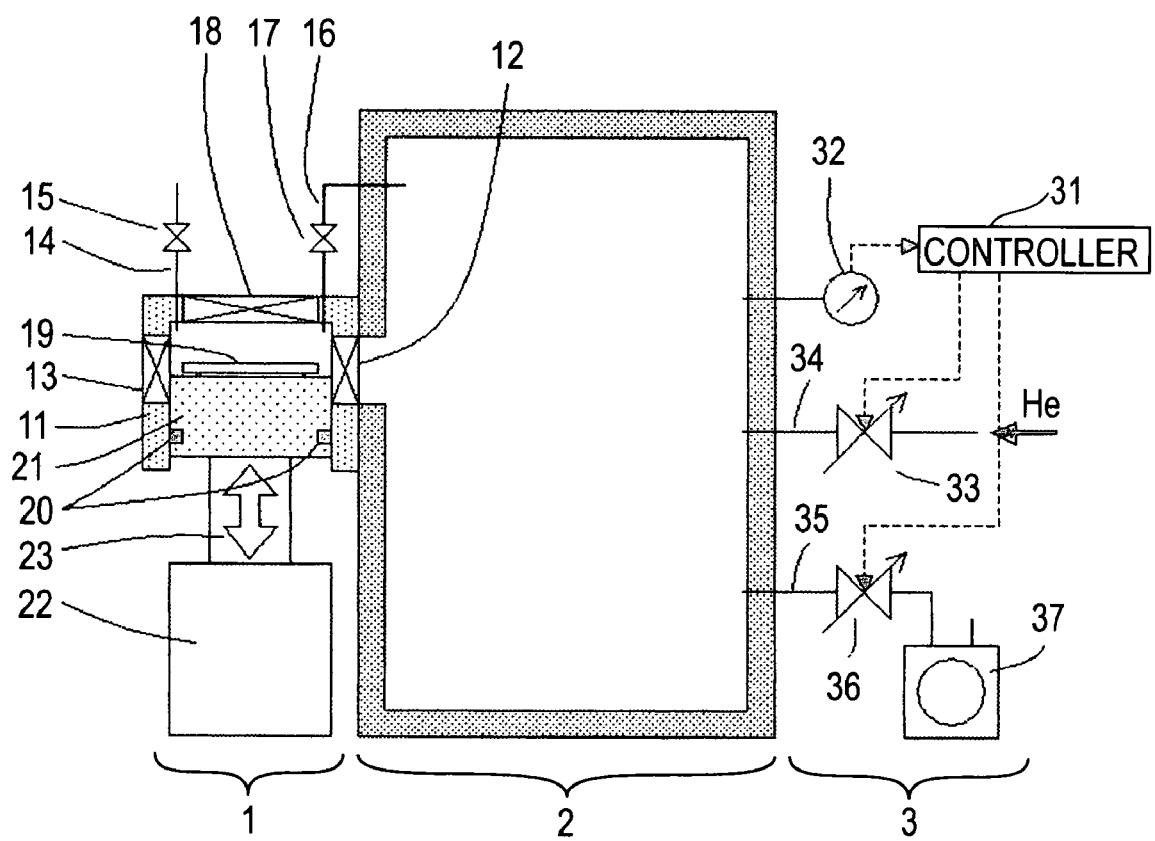
FIG. 1 is a schematic view for explaining a load-lock system according to a first embodiment of the present invention.

FIG. 1 illustrates a load-lock system according to a first embodiment of the present invention. In this embodiment, the invention is applied to an X-ray exposure apparatus in which an exposure process is carried out in a particular ambience, such as a reduced pressure He ambience, for example. Denoted at 1 is a load-lock system of the present invention. The load-lock system 1 is provided to load a substrate 19 into a main chamber 2 from the atmosphere, and also to unload the substrate 19, after an exposure process is carried out thereto inside the main chamber 2, outwardly (to the atmosphere), without breaking a particular ambience of the main chamber 2, such as a reduced pressure He ambience, for example. Denoted at 2 is the main chamber in which a process (e.g., an exposure process, in this embodiment) is to be carried out to the substrate 19 in a particular ambience. Inside the main chamber 2, there are components for carrying out an exposure process to the substrate 19, such as a conveyance robot, an original having a circuit pattern formed thereon and to be transferred to the substrate, a stage for aligning the original and the substrate, and so on, although they are not illustrated in the drawing. Denoted at 3 is an ambience maintaining system for maintaining the exposure ambience, and it functions to keep a particular ambience, such as a reduced pressure He ambience of about 20 kPa, for example.

The ambience maintaining system 3 maintains the pressure and purity inside the main chamber 2 by continuously supplying a high-purity He gas while exhausting excess He gas. Denoted at 32 is a measuring device for measuring the total pressure and the He partial pressure, inside the main chamber 2. The He gas is supplied through a He supplying pipe 34. The pipe 34 is connected to a He reservoir (not shown), such that a constant pressure He gas can be supplied continuously. Denoted at 33 is a He supply adjusting valve. By adjusting the degree of opening of the valve 33, the inflow rate into the main chamber 2 can be adjusted. Denoted at 35 is a main chamber exhaust pipe, which is connected to a vacuum pump 37 through a main chamber exhaust adjusting valve 36. By adjusting the degree of opening of the valve 36, the amount of gas exhaust from the main chamber 2 can be adjusted.

The values concerning the total pressure and the He partial pressure inside the main chamber 2, as measured by the measuring device 32, are transmitted to a control system 31. On the basis of these values, the control system 31 controls the degree of opening of the He supply adjusting valve 33 and the main chamber exhaust adjusting valve 36, by which the He pressure and purity inside the main chamber 2 can be maintained at constant levels.

The structure of the load-lock system 1 will be described below in greater detail.

Denoted at 11 is a housing of a load-lock chamber (hereinafter, it may be referred to simply as a "load-lock chamber"), which is a major component of the load-lock system 1, and it is a vacuum chamber. Denoted at 12 is a vacuum side gate valve that functions as a door between the main chamber 2 and the load-lock chamber 11, for conveyance of the substrate 19 therebetween. As this gate valve 12 is open, an opening is defined in the side wall of the load-lock chamber 11 through which a substrate can be conveyed. As the gate valve 12 is closed, the chamber can be gas-tightly closed. Denoted at 13 is an atmosphere side gate valve, and it serves as a door between the load-lock chamber 11 and the atmosphere (outside the apparatus or an ambience different from that of the exposure apparatus), for conveyance of the substrate 19 between them. When the gate valve 13 is open, an opening is defined in the side wall of the load-lock chamber 11. When it is closed, on the other hand, the load-locking wall surface is gas-tightly closed.

Denoted at 14 is a gas supply pipe for supplying a gas into the load-lock chamber 11. There is a gas supply valve 15 for supplying a gas and for stopping the gas supply. In this example, the tip end of the pipe 14 is open to the atmosphere, and the gas supplied into the load-lock chamber 11 is air. However, the pipe 14 may be connected to a gas supply line so that any desired gases appropriate to the working condition, such as dry air or dry nitrogen, for example, may be used. In this example, the pipe 14 serves to supply a gas (atmosphere) into the load-lock chamber 11 in a vacuum state when the substrate 19 is to be unloaded outwardly of the apparatus, thereby to remove a differential pressure between the atmosphere and the load-lock chamber 11 and to allow opening of the atmosphere side gate valve 13. This is because, generally, a gate valve is inoperative if there is a differential pressure as in a case wherein an atmospheric pressure is being applied only at one side. Denoted at 16 is a communication pipe for communicating the inside of the main chamber 2 and the inside of the load-lock chamber 11 with each other. The state of communication can be controlled by opening/closing a communication valve 17 provided in a portion of the pipe. The functions of the communication pipe 16 and communication valve 17 will be explained later.

Denoted at 21 is a substrate table, which constitutes a portion of the load-lock chamber housing 11. This is a table on which a substrate 19 is to be loaded, inside the load-lock chamber 11. The substrate table 21 has three pins. Since the content to the substrate 19 is limited to these three points, contamination of the substrate due to adhesion of particles can be suppressed to a lowest level. The substrate table 21 is mounted on a driving unit 22 through an arm 32 having high rigidity. The driving unit 22 is operable to move the arm 23 and the substrate table 21 integrally, upwardly and downwardly. Regarding the driving method, it may be a combination of a ball screw and a straight guide, for example. Denoted at 20 is a vacuum seal provided around the circumference of the side face of the substrate table 21. The seal 20 is slidable between the substrate table and the inner wall of the load-lock chamber 11, and it has a vacuum locking function. In this example, the seal 20 is a seal member, such as an O-ring, for example. However, a labyrinth structure may be used and, by differential exhausting, vacuum locking may be accomplished. Alternatively, a bellows structure may be used.

By moving the substrate table 21 upwardly or downwardly through the driving unit 22, the inside volume or capacity of the load-lock chamber 11 into which the substrate 19 is to be mounted can be changed.

Denoted at 18 is a door opening to the atmosphere, which is provided at the ceiling of the load-lock chamber 11. This door is provided to define an opening, as the substrate table 21 is raised, for exhausting the inside gas (air) of the load-lock chamber 11 outwardly. If isolation from the atmosphere is necessary, the door 18 is closed and vacuum locking is accomplished. The opening of the door 18 should be sufficiently wide to avoid compression of the gas (air) as the substrate table 21 is raised. For this reason, the door 18 should desirably have a gate valve structure used for loading/unloading the substrate 19. A filter (not shown) may be provided at the top of the door 18, to prevent particles from entering the load-lock chamber 11.

The operation of the load-lock system 1 will now be described in sequence.

Figure 2A:
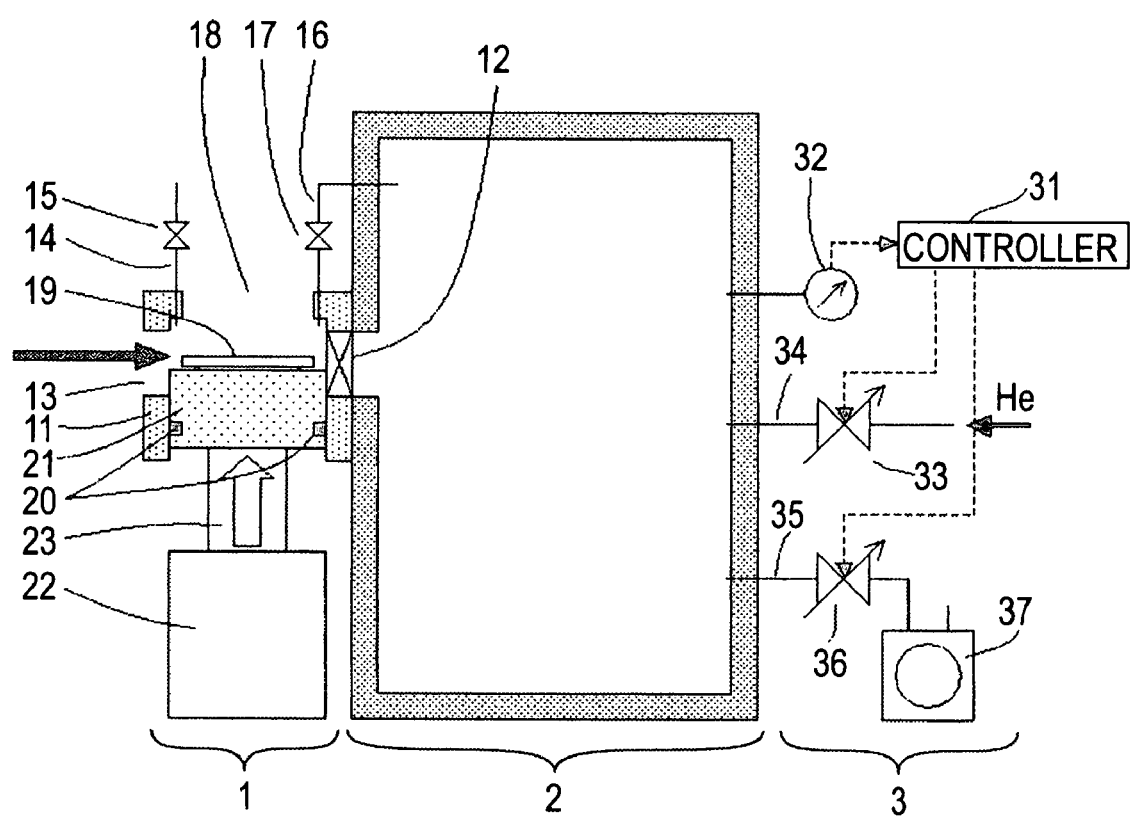
FIG. 2A is a schematic view for explaining a state in which a substrate is loaded into a load-lock chamber, in the first embodiment of the present invention.

Initially, the sequence for conveying a substrate from the atmosphere into the main chamber 2, having a reduced pressure He ambience, will be explained. An initial state is that the atmosphere side gate valve 13 is open, while the remaining valves are closed, and the substrate table 21 is at its lowered position. From this initial state, a substrate 19 is conveyed out of a substrate cassette in the atmosphere up to the substrate table 21 inside the load-lock chamber 11. The substrate 21 is in the lowered state. When the substrate table 21 is lowered, a sufficient space for loading the substrate into the load-lock chamber 11 is obtainable. After the substrate 19 is conveyed onto the substrate table 21, the door 18 opening to the atmosphere is opened. FIG. 2A shows this state.

Figure 2B:
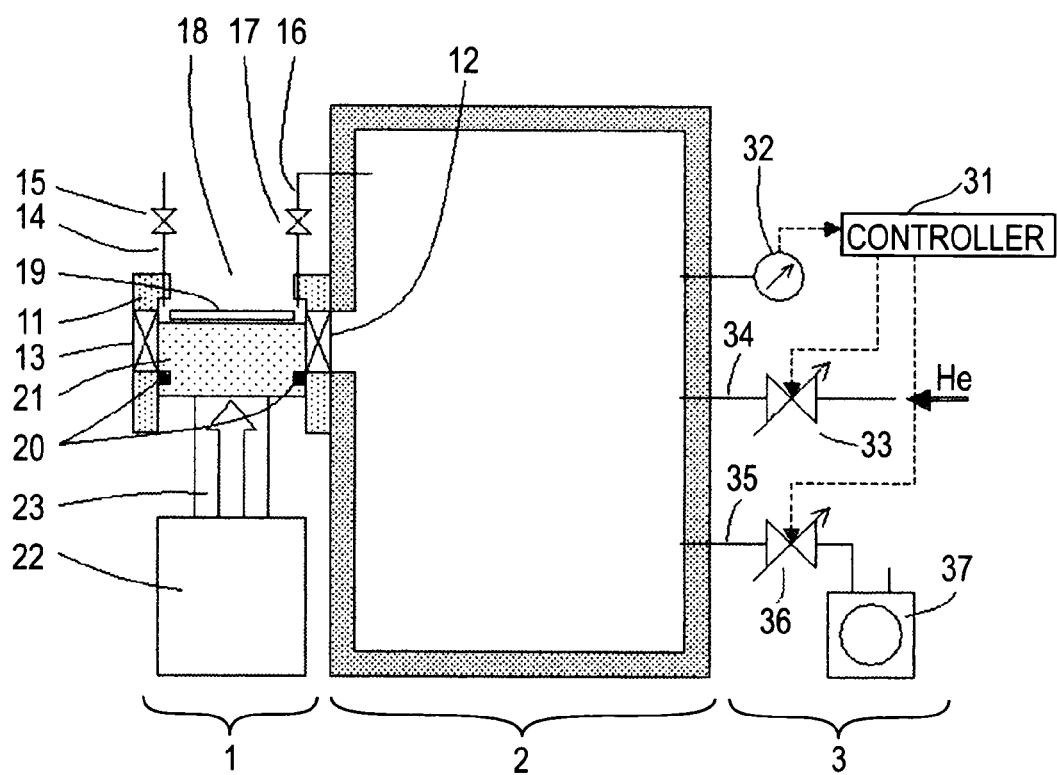
FIG. 2B is a schematic view for explaining a state in which a substrate table is raised, in the first embodiment of the present invention.

Subsequently, the atmosphere side gate valve 13 is closed and the driving unit 22 is actuated to raise the substrate table 21. At this time, the air inside the load-lock chamber 11 is pushed and discharge outwardly through the opening of the door 18. FIG. 2B shows the state in which the substrate table 21 has been raised.

Figure 2C:
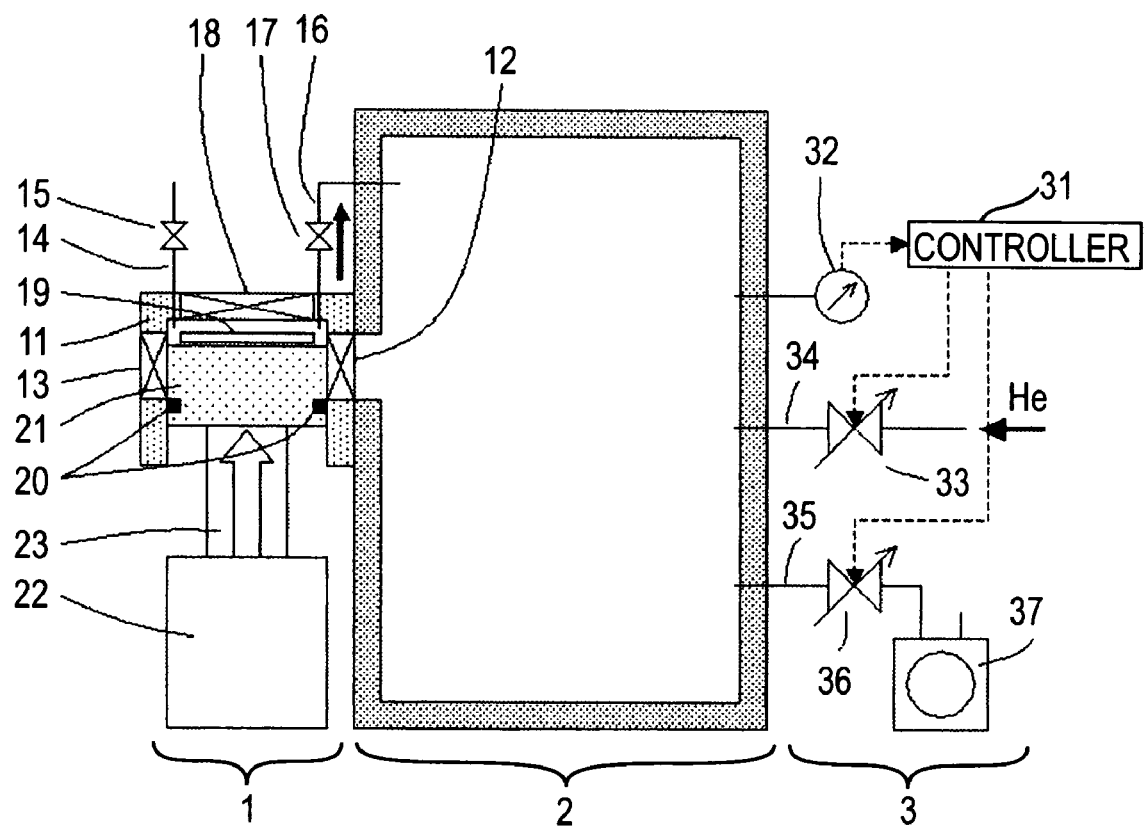
FIG. 2C is a schematic view for explaining a communicated state, in the first embodiment of the present invention.

After the table 21 is raised, the door 18 is closed. When the table 21 is at its raised position, the inside volume of the load-lock chamber is smallest, and only a little air remains there. After this, the communication valve 17 is opened to bring the load-lock chamber 11 and the main chamber 2 in communication with each other. Although a very small amount of air flows into the main chamber 2 from the load-lock chamber 11, the pressure is instantaneously balanced, and the load-lock chamber 11 and the main chamber 2 have the same ambience. FIG. 2C shows this state. As the air flows into the main chamber 2, the He purity and the pressure inside the main chamber 2 will change. However, by making the inside capacity of the load-lock chamber 11, as the substrate table 21 is in its raised position, very small as compared with the capacity of the main chamber, such a change can be made small within an allowable range. The ambience of the main chamber 2 having its pressure and He purity changed by a small amount, can resume its original condition shortly, with the aid of the ambience maintaining system 3.

Figure 2D:
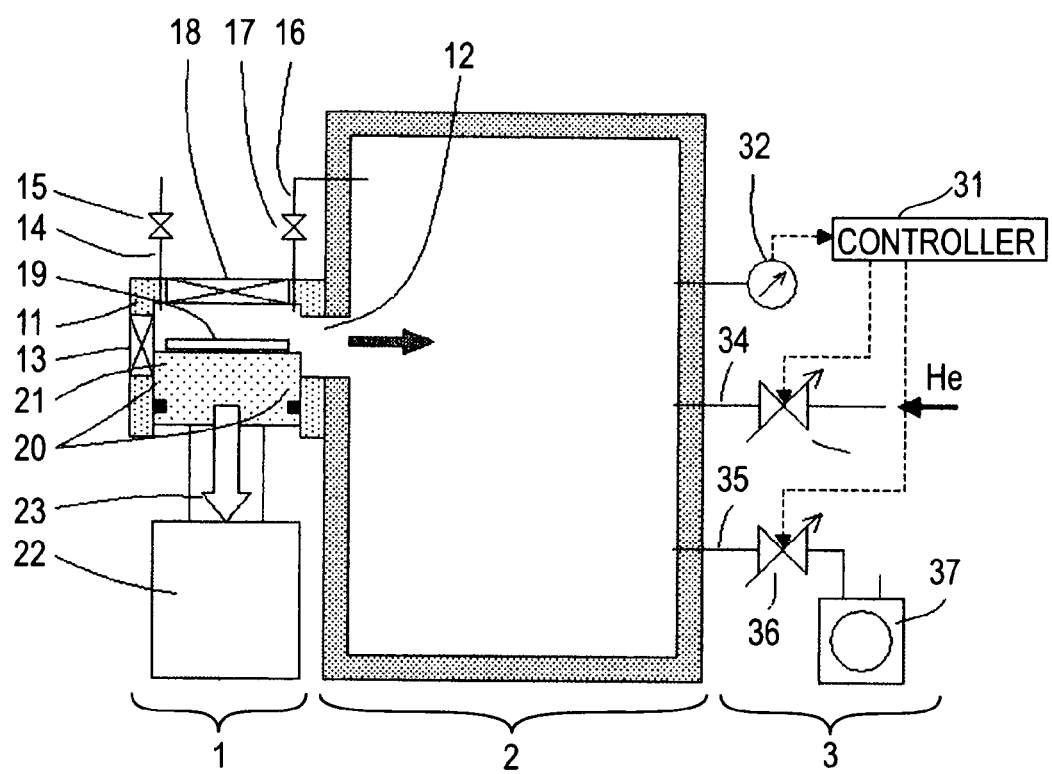
FIG. 2D is a schematic view for explaining a state of loading a substrate into a main chamber, in the first embodiment of the present invention.

After the communication valve 17 is opened, the vacuum side gate valve 12 is opened. At the same time, the substrate table 21 is lowered. FIG. 2D shows this state. As the substrate table 21 is lowered, the total volume of the reduced pressure He gas increases. Here, the control system 31 inside the ambience maintaining unit 3 operates to increase the He injection amount in accordance with changes in the He gas pressure and, therefore, the He gas pressure can be kept constant.

As the table 21 is lowered, a sufficient space for conveyance of the substrate 19 is assured. Thus, by means of a conveyance robot (not shown) inside the main chamber 2, the substrate 19 is conveyed to an exposure position inside the main chamber 2.

With the procedure described above, substrate conveyance from the atmosphere into the main chamber having a reduced pressure He ambience is completed.

Next, the sequence of conveying a substrate from the main chamber 2 into the atmosphere will be explained.

The state just before initiation of the substrate unloading is that the atmosphere side gate valve 13, the vacuum side gate valve 12, the gas supply valve 15 and the communication valve 17 are all closed.

Figure 3A:
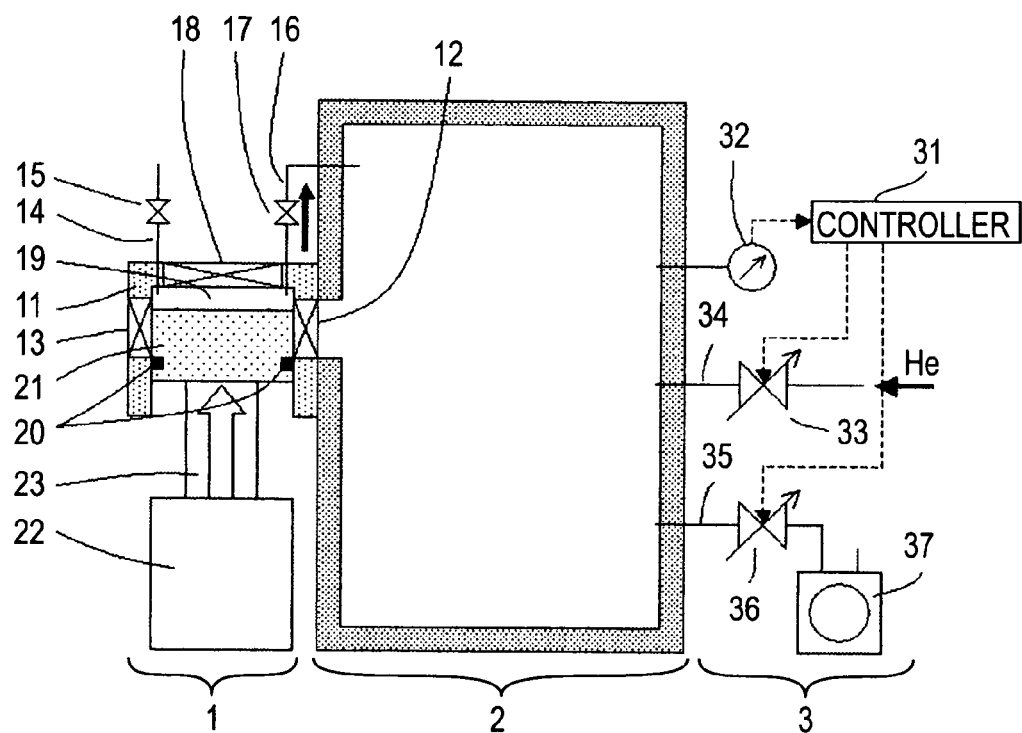
FIG. 3A is a schematic view for explaining the communicated state prior to unloading of the substrate, in the first embodiment of the present invention.
Figure 3B:
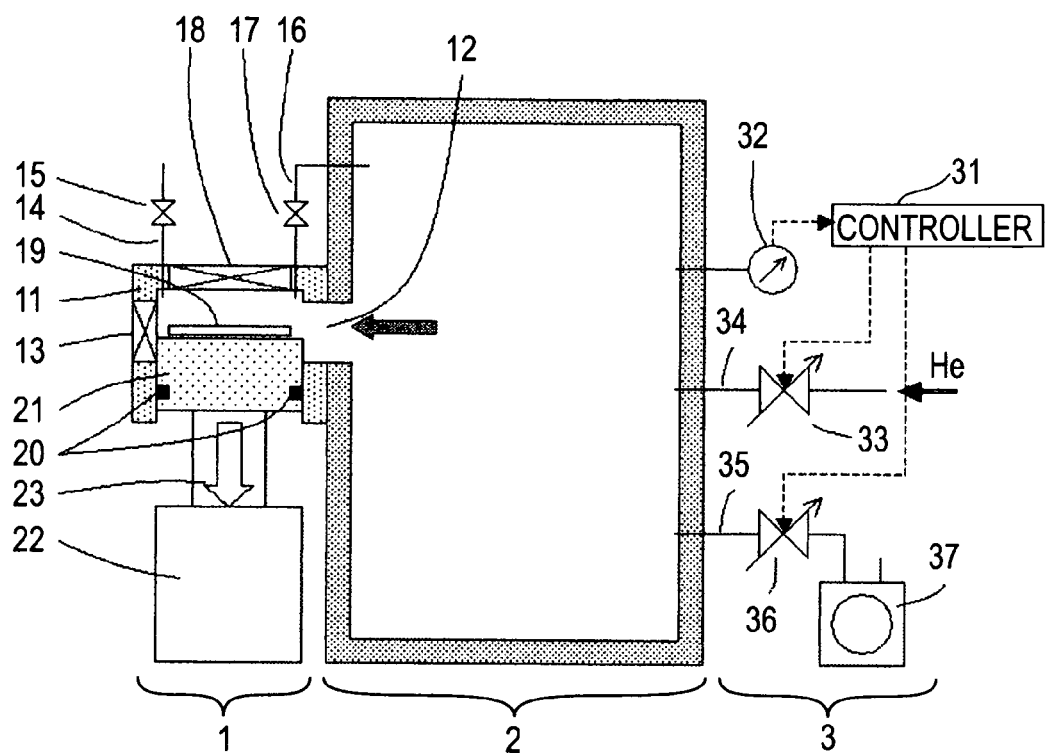
FIG. 3B is a schematic view for explaining a state in which a substrate is unloaded and conveyed to the load-lock system, in the first embodiment of the present invention.

Initially, the communication valve 17 is opened to provide the same ambience in the load-lock chamber 11 and the main chamber 2 (FIG. 3A). Subsequently, the vacuum side gate valve 12 is opened and, simultaneously therewith, the driving unit 22 drives the substrate table 21 to move it downwardly to secure a sufficient space. Thereafter, by means of a conveyance robot (not shown), the substrate 19 is unloaded and placed onto the substrate table 21 from the main chamber 2 (FIG. 3B).

Figure 3C:
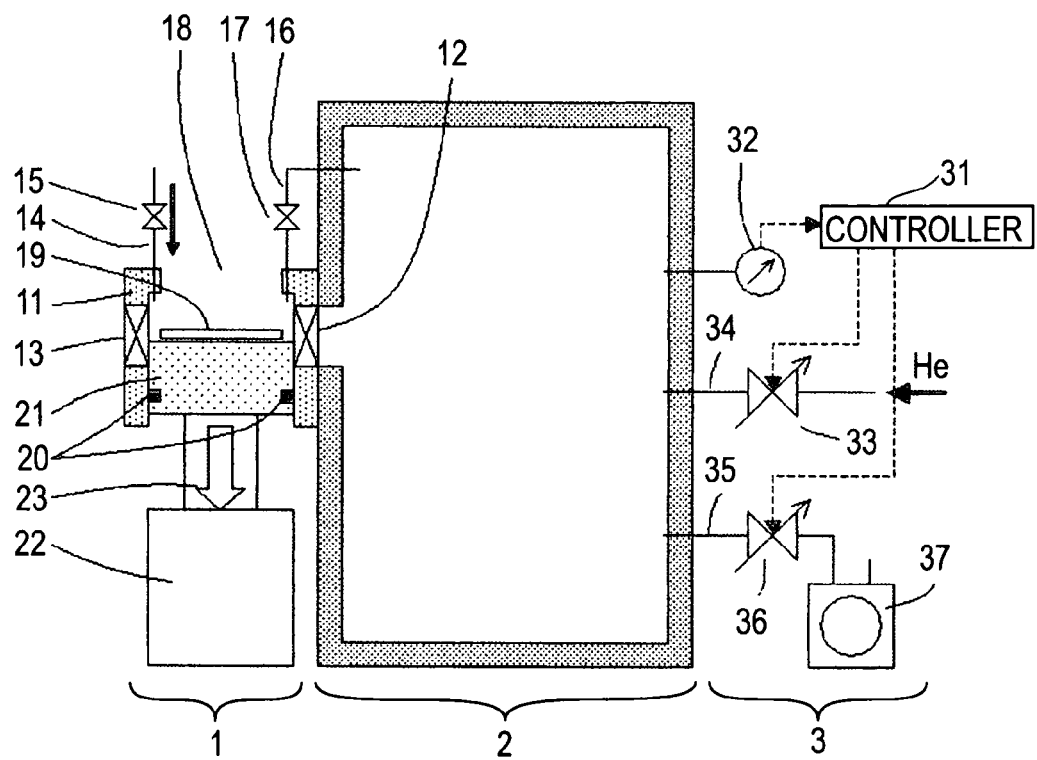
FIG. 3C is a schematic view for explaining a state in which the load-lock system is opened to the atmosphere, in the first embodiment of the present invention.

After this, the vacuum side gate valve 12 is closed. After the valve is closed, the gas supply valve 15 is opened and the inside of the load-lock chamber 11 is filled with atmosphere. Then, the door 18 is opened, and the substrate table 21 is lowered (FIG. 3C). Since the door 18 is open, as the table 21 is lowered, the atmosphere can flow into the load-lock chamber 11 without resistance.

Figure 3D:
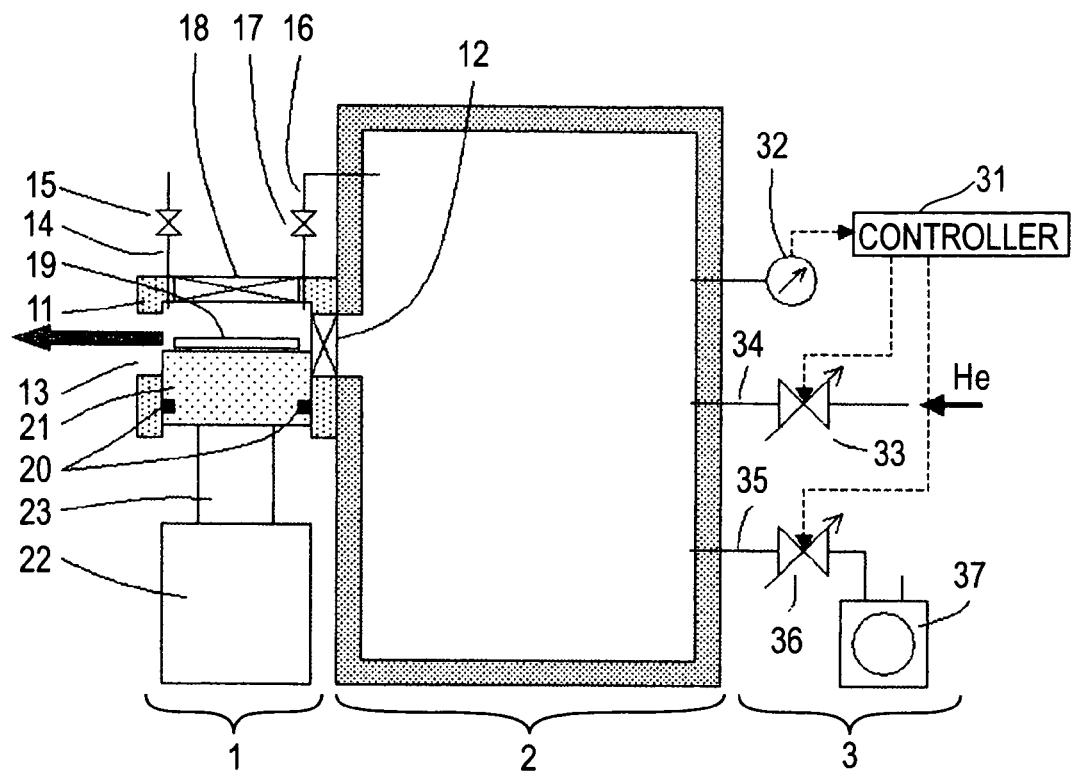
FIG. 3D is a schematic view for explaining a state in which a substrate is conveyed outwardly to the atmosphere, in the first embodiment of the present invention.

Then, the atmosphere side gate valve 13 is opened, and the substrate 19 is unloaded by a conveyance robot (not shown) outwardly of the load-lock chamber 11 (FIG. 3D).

With the procedure described above, conveyance of the substrate from the main chamber into the atmosphere is completed.

In conventional load-lock systems, for loading a substrate, the inside of the load-lock chamber has to be once vacuum evacuated. In order to avoid freezing of moisture content due to adiabatic expansion of the air during the exhaust, and the resultant temperature decrease of the substrate as well, the exhausting operation should be done slowly, while spending a long time.

As compared therewith, in the load-lock system 1 of the X-ray exposure apparatus, according to this embodiment, there is no process in the substrate loading that involves adiabatic expansion of air. Hence, there is no possibility of freezing the moisture content or a temperature decrease of the substrate, and high-speed substrate conveyance can be accomplished. Furthermore, use of an exhaust pump for load-locking is unnecessary, and this effectively decreases the cost of the apparatus.

In this embodiment, various valves are controlled by control means, such as a microcomputer provided inside the apparatus, and they can be actuated automatically.

As regards the door 18 opening to the atmosphere, it is not always necessary to provide the same at the ceiling. It may be provided at a side wall, near the ceiling. Alternatively, the atmosphere side gate valve 13 may be used also as the door opening to the atmosphere.

Embodiment 2

Figure 4:
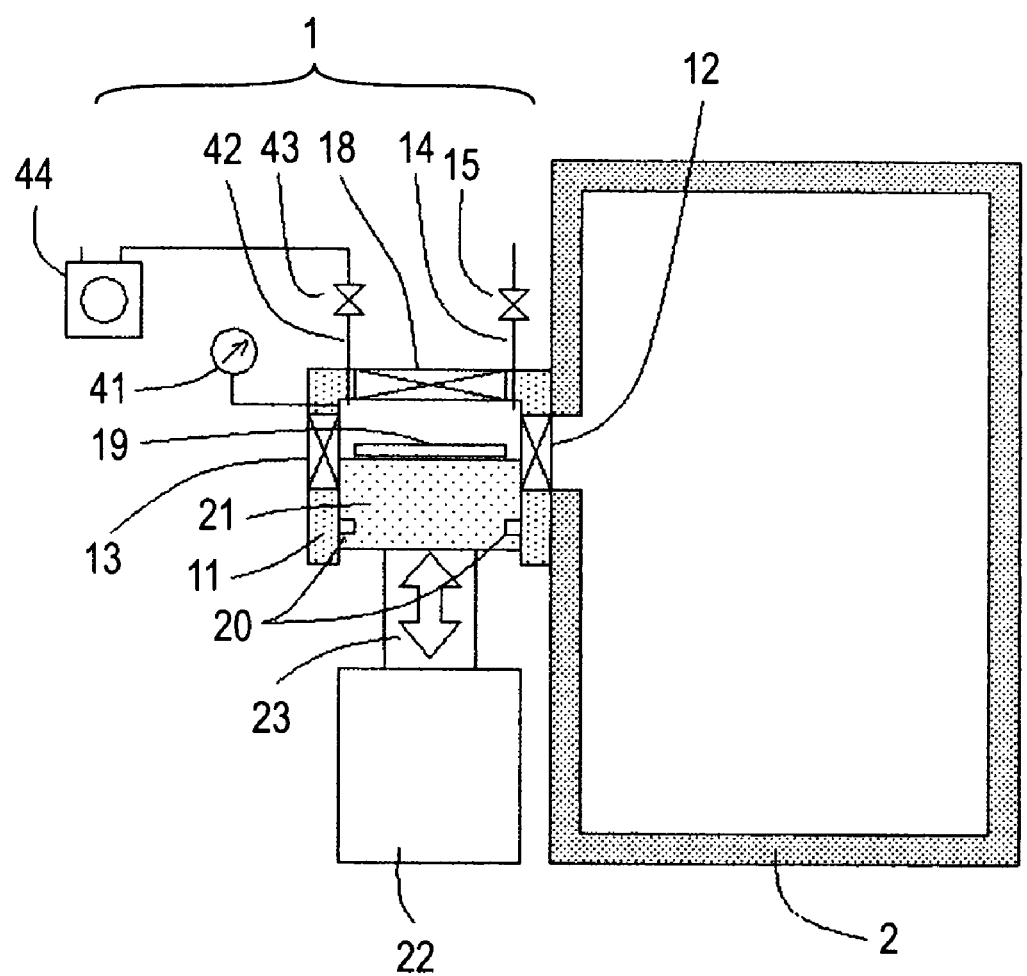
FIG. 4 is a schematic view for explaining a load-lock system according to a second embodiment of the present invention.

FIG. 4 illustrates a load-lock system according to a second embodiment of the present invention. In this embodiment, the invention is applied to an EUV exposure apparatus in which the exposure process is carried out in a vacuum ambience. In this embodiment, components having corresponding functions as those of the first embodiment are denoted by like numerals, and a detailed description of them will be omitted.

Denoted at 1 is a load-lock system of the present invention. The load-lock system 1 is provided to load a substrate 19 into a main chamber 2 from the atmosphere and also to unload the substrate, after an exposure process is carried out thereto inside the main chamber 2, outwardly (to the atmosphere), without breaking a vacuum ambience of the main chamber 2. Denoted at 2 is the main chamber, which is normally exhausted by means of a vacuum pump, and a vacuum level is maintained therein. Inside the main chamber 2, there are components for carrying out an exposure process to the substrate 19, such as a conveyance robot, an original having a circuit pattern formed thereon and to be transferred to the substrate, a stage for aligning the original and the substrate, and so on, although they are not illustrated in the drawing.

The structure of the load-lock system 1 will be described below in greater detail.

Denoted at 11 is a load-lock chamber (housing), which is a major component of the load-lock system 1, and it is a vacuum chamber. Denoted at 12 is a vacuum side gate valve that functions as a door for conveyance of the substrate 19 between the main chamber 2 and the load-lock chamber 11. Denoted at 13 is an atmosphere side gate valve, and it serves as a door between the load-lock chamber 11 and the atmosphere side (outside the apparatus), for conveyance of the substrate 19 between them. Denoted at 14 is a gas supply pipe for supplying a gas into the load-lock chamber 11. There is a gas supply valve 15, provided in a portion of the gas supply pipe 14. In this example, the tip end of the pipe 14 is open to the atmosphere, and the gas supplied into the load-lock chamber 11 is air. However, the pipe 14 may be connected to a gas supply line so that dry air or dry nitrogen, for example, may be supplied.

Denoted at 41 is a vacuum gauge for measuring the pressure (vacuum level) inside the load-lock chamber 11. Denoted at 42 is an exhaust pipe, which is connected to a load-lock exhaust pump 44 via an exhaust valve 43 provided in a portion of the exhaust pipe. The exhaust pump 44 is normally operated and, when the exhaust valve 43 is open, it functions to perform vacuum evacuation of the load-lock chamber 11.

Denoted at 21 is a substrate table. This is a table on which a substrate 19 is to be loaded, inside the load-lock chamber 11. The substrate table 21 has three pins. Since the contact to the substrate 19 is limited to these three points, contamination of the substrate due to adhesion of particles can be suppressed to a lowest level. The substrate table 21 is mounted on a driving unit 22 through an arm 32 having high rigidity. The driving unit 22 is operable to move the arm 23 and the substrate table 21 integrally, upwardly and downwardly. Regarding the driving method, it may be a combination of a ball screw and a straight guide, for example. Denoted at 20 is a vacuum seal provided around the circumference of the side face of the substrate table 21. The seal 20 is slidable between the substrate table and the inner wall of the load-lock chamber 11, and it has a vacuum locking function. In this example, the seal 20 is a seal member, such as an O-ring, for example. However, a labyrinth structure may be used and, by differential exhausting, vacuum locking may be accomplished. Alternatively, a bellows structure may be used.

By moving the substrate table 21 upwardly or downwardly through the driving unit 22, the inside volume or capacity of the load-lock chamber 11 into which the substrate 19 is to be mounted can be changed.

Denoted at 18 is a door opening to the atmosphere, which is provided at the ceiling of the load-lock chamber 11. This door is provided to define an opening, as the substrate table 21 is raised, for exhausting the inside gas (air) of the load-lock chamber 11 outwardly. If the load-lock chamber is to be exhausted, for example, the door 18 is closed and vacuum locking is accomplished. The opening of the door 18 should be sufficiently wide to avoid compression of the gas (air) as the substrate table 21 is raised. For this reason, the door 18 should desirably have a gate valve structure used for loading/unloading the substrate 19. A filter (not shown) may be provided at the top of the door 18, to prevent particles from entering the load-lock chamber 11.

The operation of the load-lock system 1 will now be described in sequence.

Figure 5A:
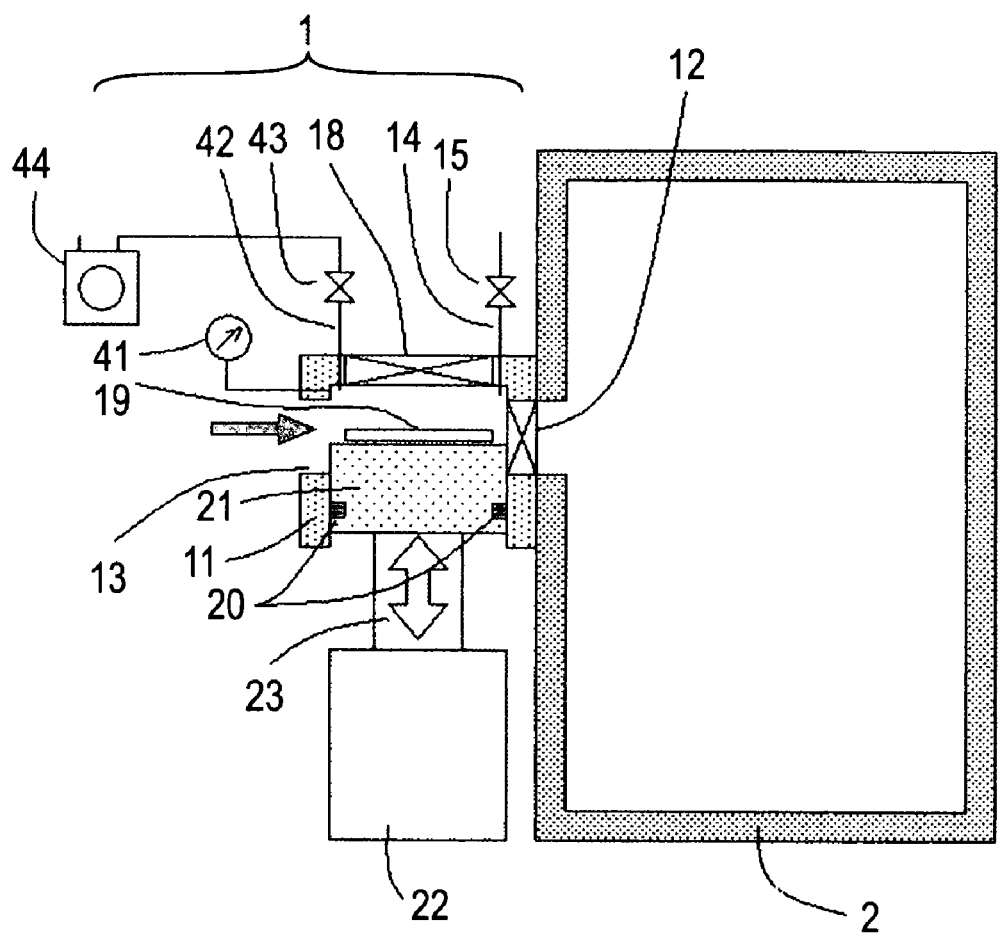
FIG. 5A is a schematic view for explaining a state in which a substrate is loaded into a load-lock chamber, in the second embodiment of the present invention.

An initial state is that the atmosphere side gate valve 13 is open while the remaining valves are closed, and the substrate table 21 is at its lowered position. FIG. 5A shows the state in which, from this initial state, a substrate 19 is conveyed out of a substrate cassette in the atmosphere up to the substrate table 21 inside the load-lock chamber 11. Here, the substrate 21 is in the lowered state. When the substrate table 21 is lowered, a sufficient space for loading the substrate into the load-lock chamber 11 is obtainable. After the substrate 19 is conveyed onto the substrate table 21, the door 18 opening to the atmosphere is opened.

At the same time as the door 18 is opened, the driving unit 22 is actuated to raise the substrate table 21. The air inside the load-lock chamber 11 is pushed outwardly through the opening of the door 18.

Figure 5B:
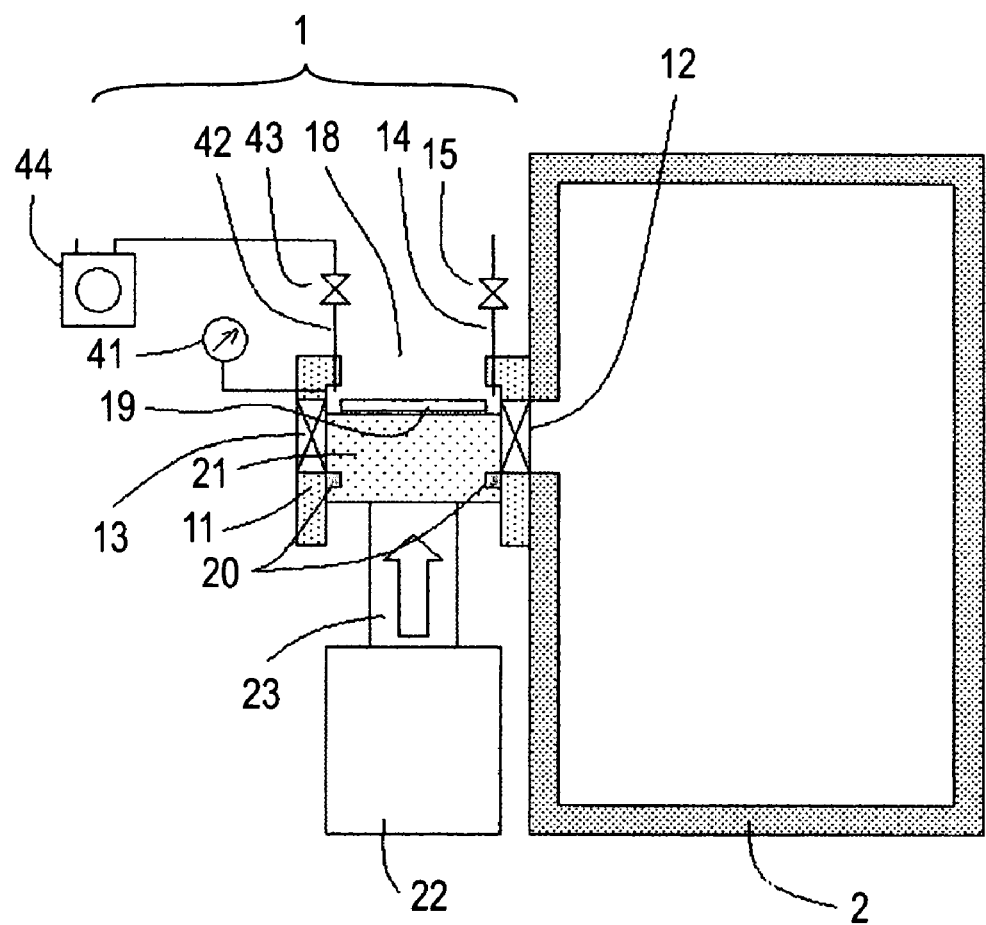
FIG. 5B is a schematic view for explaining a state in which a substrate table is raised, in the second embodiment of the present invention.
Figure 5C:
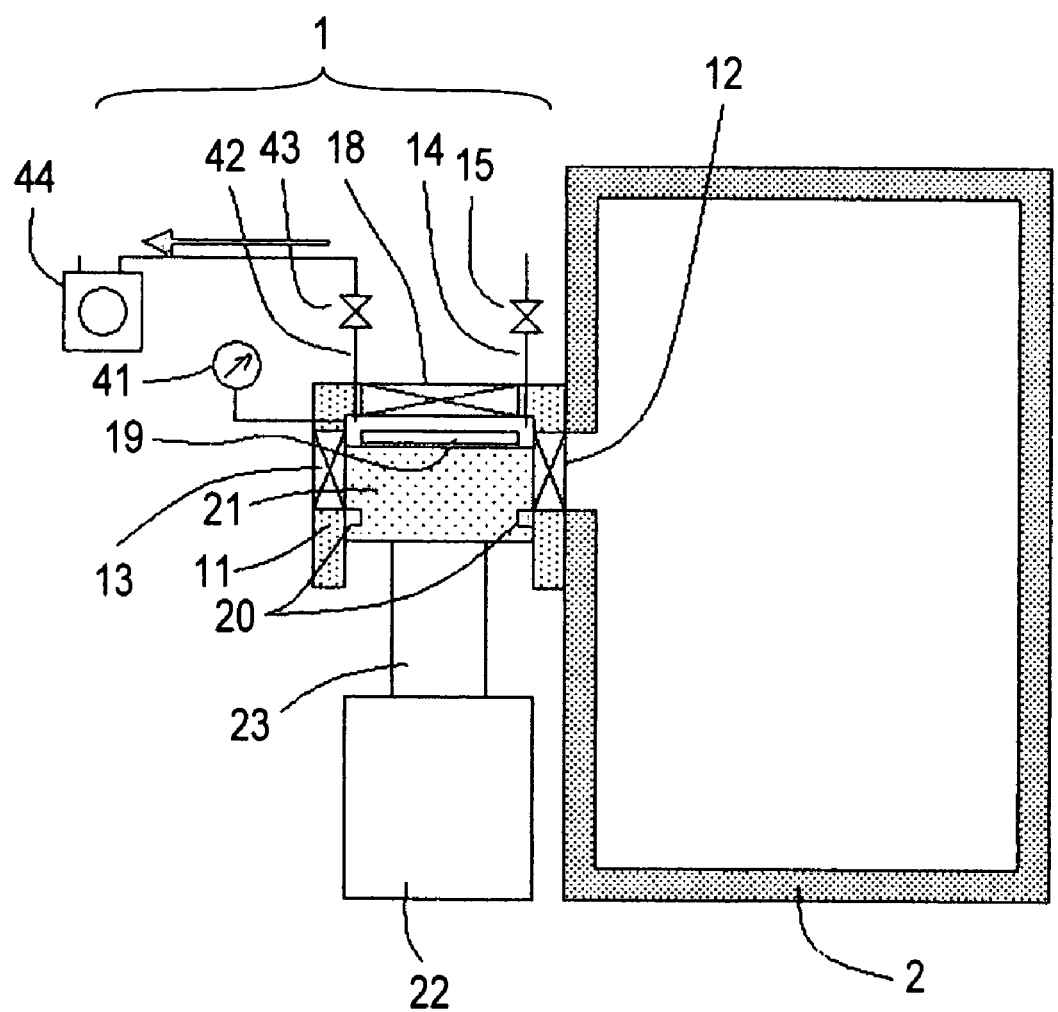
FIG. 5C is a schematic view for explaining a state of vacuum evacuation, in the second embodiment of the present invention.

Thereafter, the door 18 and the atmosphere side gate valve 13 are closed. FIG. 5B shows this state. As the substrate table 21 is at a raised position, the capacity of the load-lock chamber 11 is smallest, and only a small amount of air remains there. From this state, the exhaust valve 43 is opened, and the air inside the load-lock chamber 11 is exhausted. For reasons to be described later, the exhaust valve 43 may be fully opened at once. FIG. 5C shows the state in which vacuum evacuation is carried out.

In conventional load-lock systems as described hereinbefore, if exhausting is carried out rapidly, due to adiabatic expansion of the air, moisture content in the air will freeze to contaminate the substrate, or the substrate temperature decreases undesirably. Therefore, in conventional load-lock systems, it is necessary to control the degree of opening of the exhaust valve to carry out the vacuum evacuation slowly. In the load-lock system 1 of this embodiment, as compared therewith, since only a limited amount of air remains inside the load-lock chamber 1, even if the exhausting is made at a high speed, freezing of the moisture content and a decrease of substrate temperature can be well suppressed.

Because the gas to be exhausted is little, as the exhaust valve 43 is opened, a high vacuum is created inside the load-lock chamber 11 in a very short time. The vacuum level inside the load-lock chamber 11 is monitored by the vacuum gauge 41, and if a predetermined level is reached, the exhaust valve 43 is closed.

Figure 5D:
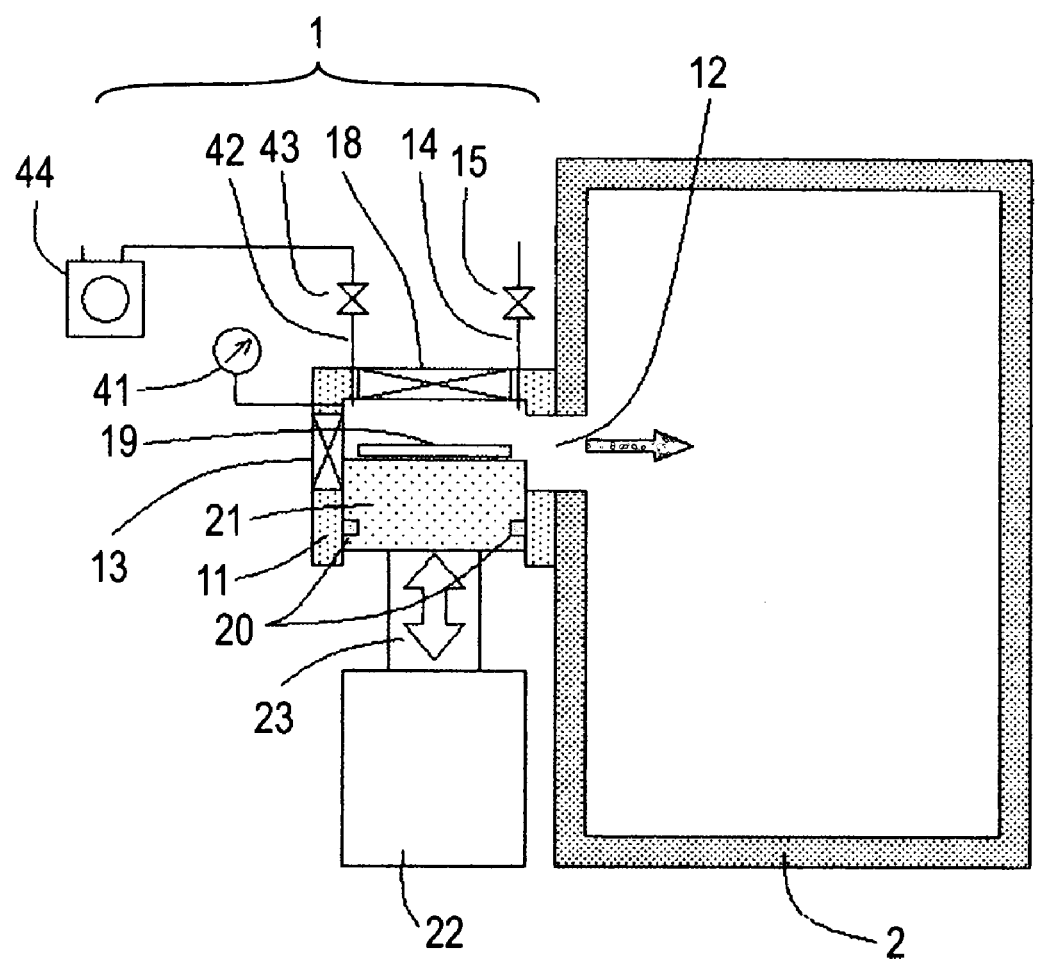
FIG. 5D is a schematic view for explaining a state of loading a substrate into a main chamber, in the second embodiment of the present invention.

After the valve 43 is closed, the vacuum side gate valve 12 is opened and, simultaneously therewith, the driving unit 22 is actuated to move the substrate table 21 downwardly. When the table 21 is lowered, since both of the inside of the load-lock chamber 11 and the inside of the main chamber 2 are already in a vacuum state, no problem arises even if the volume changes. FIG. 5D shows the state in which the substrate table 21 has moved downwardly. After the table 21 is lowered, the substrate 19 is conveyed by a conveyance robot (not shown) to an exposure position inside the main chamber 2, for example.

Figure 6:
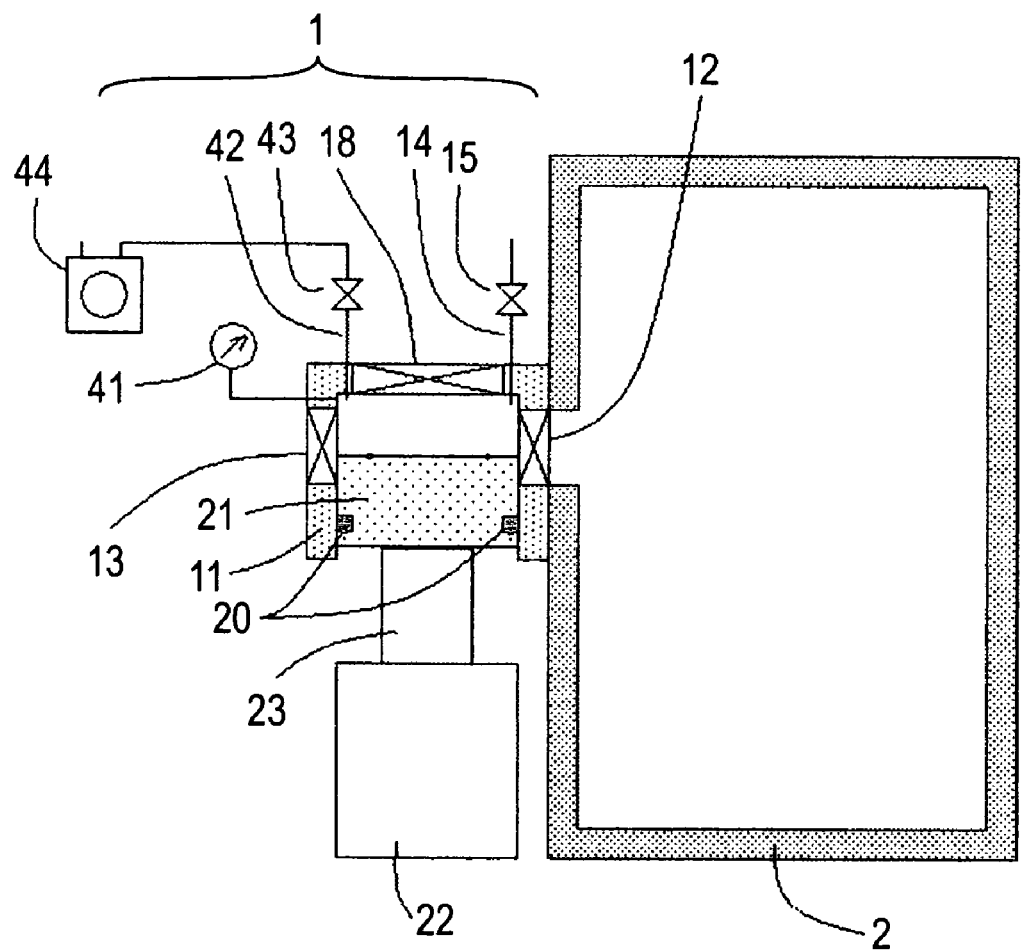
FIG. 6 is a schematic view for explaining a state in which substrate conveyance is completed, in the second embodiment of the present invention.

With the procedure described above, conveyance of the substrate 19 from the atmosphere into the main chamber 2 of a vacuum ambience is completed. After the conveyance, the vacuum side gate valve 12 is closed (FIG. 6).

Figure 7:
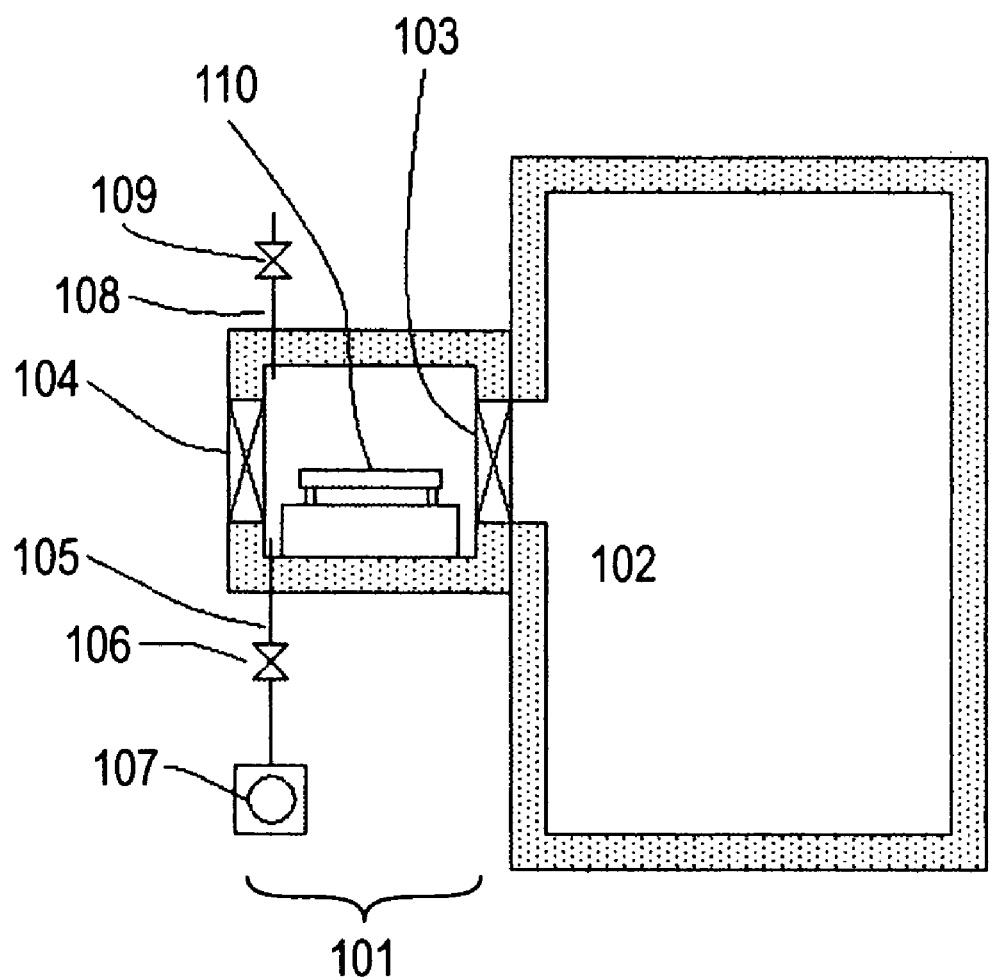
FIG. 7 is a schematic view of a known type of load-lock system.

The sequence of unloading the substrate from the main chamber 2 back to the atmosphere is essentially the same as that of the conventional load-lock system, and a description thereof will be omitted. This would be readily understood from the fact that the state shown in FIG. 6 is similar to that of FIG. 7, having been described with reference to the conventional example.

In accordance with the load-lock chamber 11 of this embodiment, the volume is made changeable and, by doing so, the space for substrate conveyance is secured on one hand and, since the volume of gas to be exhausted is made to be smaller, high-speed evacuation is enabled on the other hand.

In this embodiment, various valves are controlled by control means, such as a microcomputer provided inside the apparatus, and they can be actuated automatically.

As regards the door 18 opening to the atmosphere, it is not always necessary to provide the same at the ceiling. It may be provided at a side wall, near the ceiling. Alternatively, the atmosphere side gate valve 13 may be use also as the door opening to the atmosphere.

Figure 8:
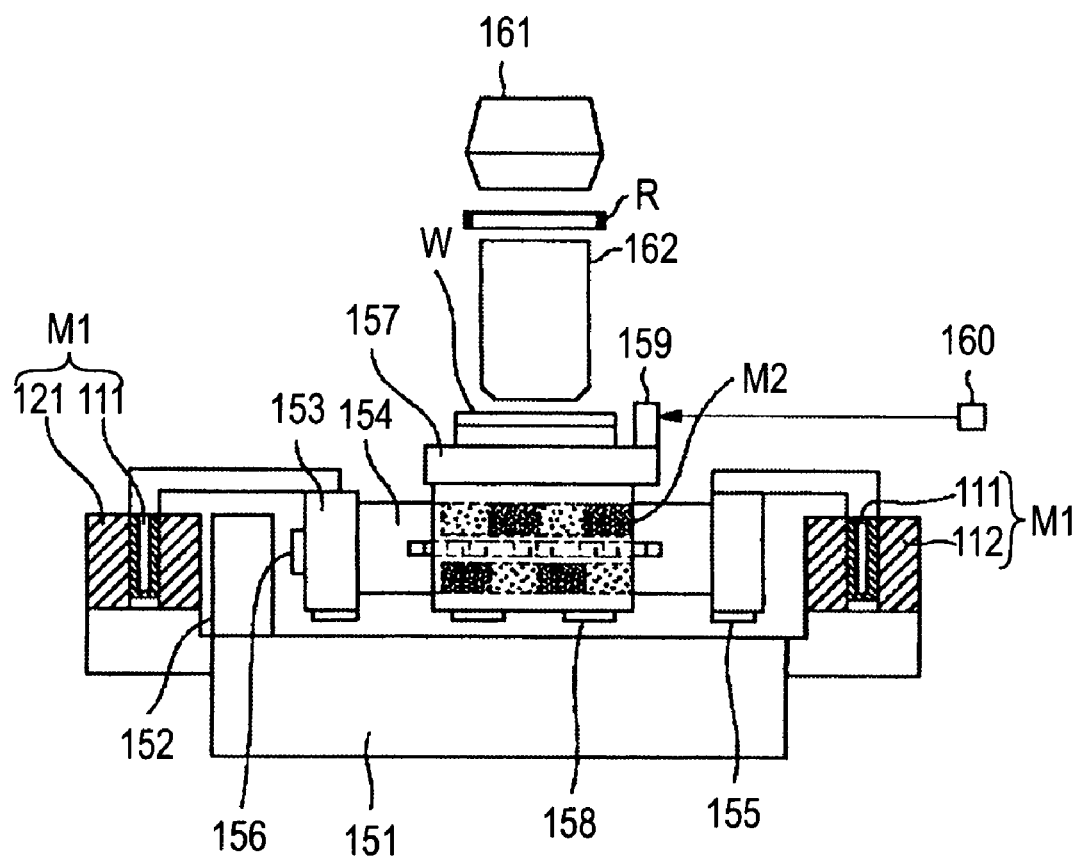
FIG. 8 is a schematic view, showing an example of an exposure apparatus.
Figure 9:
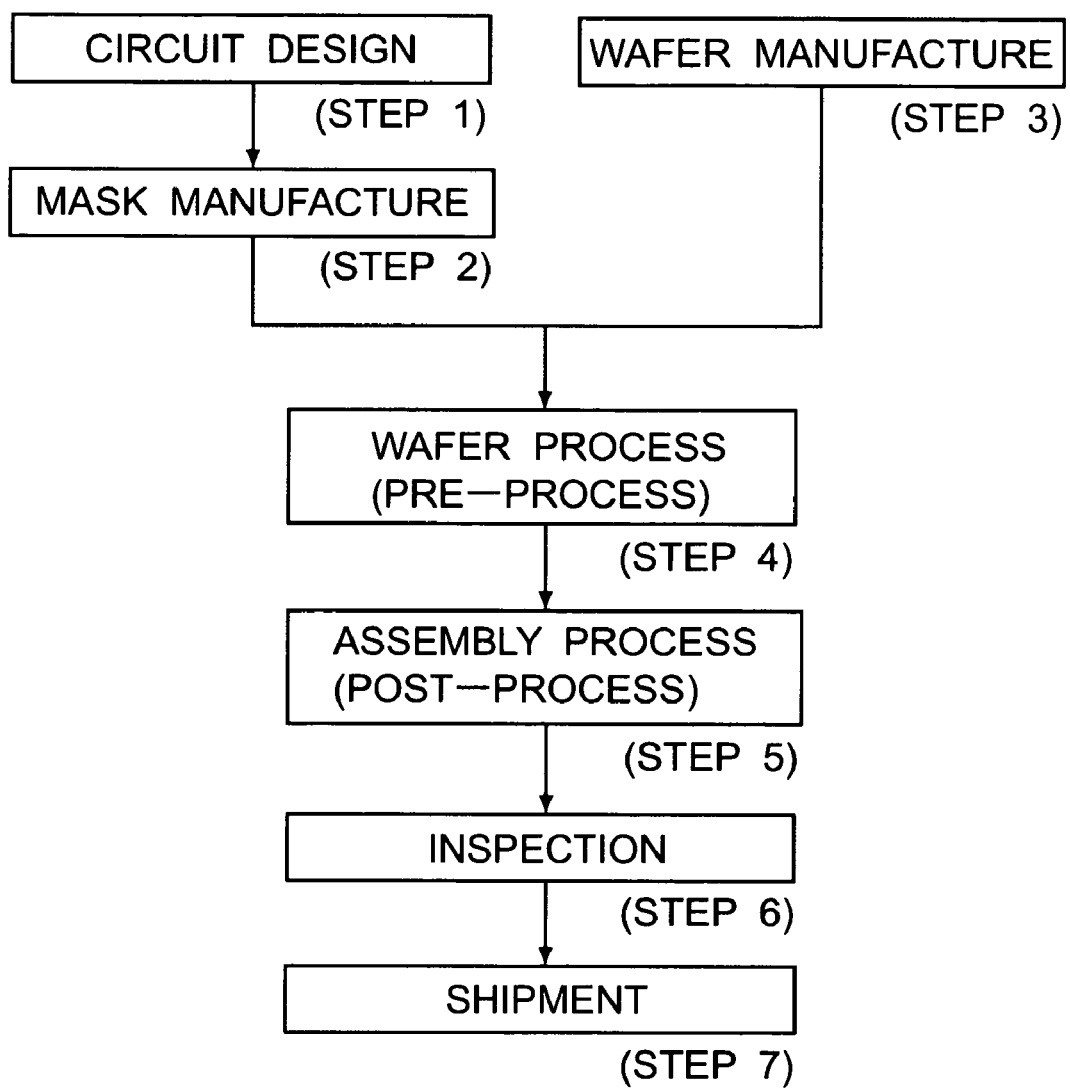
FIG. 9 is a flow chart for explaining the procedure of device manufacturing processes.

FIG. 8 shows an exposure apparatus for device manufacture, to which a load-lock system as described hereinbefore is incorporated.

This exposure apparatus is to be used for the manufacture of microdevices having a fine pattern formed thereon, such as semiconductor devices (semiconductor integrated circuits, for example), micromachines, or thin-film magnetic heads, for example. In this exposure apparatus, exposure light (which may include visible light, ultraviolet light, EUV light, X-rays, an electron beam, and a charged particle beam, for example) as exposure energy supplied from a light source 161 illuminates a reticle R (original) and light from the reticle R is projected onto a semiconductor wafer W (substrate) through a projection system having a projection lens 162 (which may include a refractive lens, a reflective lens, a catadioptric lens system, and a charged particle lens, for example), whereby a desired pattern is produced on the substrate.

The exposure apparatus includes a base table 151 having a guide 152 and a linear motor stator 121 fixed thereto. The linear motor stator 121 has a multiple-phase electromagnetic coil, while a linear motor movable element 111 includes a permanent magnet group. The linear motor movable portion 111 is connected as a movable portion 153 to a movable guide 154 (stage), and through the drive of the linear motor M1, the movable guide 154 can be moved in a direction of a normal to the sheet of the drawing. The movable portion 153 is supported by a static bearing 155, taking the upper surface of the base table 151 as a reference, and also by a static bearing 156, taking the side surface of the guide 152 as a reference.

A movable stage 157, which is a stage member disposed to straddle the movable guide 154, is supported by a static bearing 158. This movable stage 157 is driven by a similar linear motor M2, so that the movable stage 157 moves leftwardly and rightwardly as viewed in the drawing, while taking the movable guide 154 as a reference. The motion of the movable stage 157 is measured by means of an interferometer 160 and a mirror 59, which is fixed to the movable stage 159.

A wafer (substrate) W is held on a chuck, which is mounted on the movable stage 157, and a pattern of the reticle R is transferred in a reduced scale onto different regions on the wafer W by means of the light source 161 and the projection optical system 162, in accordance with a step-and-repeat method or a step-and-scan method.

It should be noted that the load-lock system of the present invention described hereinbefore also can be similarly applied to an exposure apparatus in which, without using a mask, a circuit pattern is directly drawn on a semiconductor wafer to expose a resist thereon.

Next, an embodiment of a device manufacturing method, which uses an exposure apparatus described above, will be explained.

FIG. 19 is a flow chart for explaining the overall procedure for semiconductor manufacture. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process, which is called a pre-process, wherein, by using the thus prepared mask and wafer, a circuit is formed on the wafer in practice, in accordance with lithography. Step 5 subsequent to this is an assembling step, which is called a post-process, wherein the wafer having been processed at step 4 is formed into the semiconductor chips. This step includes an assembling (dicing and bonding) processing and a packaging (chip sealing) process. Step 6 is an inspection step wherein an operation check, a durability check, and so on, for the semiconductor devices produced by step 5 are carried out. With these processes, semiconductor devices are produced, and they are shipped (step 7).

More specifically, the wafer process at step 4 described above includes: (i) an oxidation process for oxidizing the surface of the wafer; (ii) a CVD process for forming an insulating film on the wafer surface; (iii) an electrode forming process for forming electrodes upon the wafer by vapor deposition; (iv) an ion implanting process for implanting ions to the wafer; (v) a resist process for applying a resist (photosensitive material) to the wafer; (vi) an exposure process for printing, by exposure, the circuit pattern of the mask on the wafer through the exposure apparatus described above; (vii) a developing process for developing the exposed wafer; (viii) an etching process for removing portions other than the developed resist image; and (ix) a resist separation process for separating the resist material remaining on the wafer after being subjected to the etching process. By repeating these processes, circuit patterns are superposedly formed on the wafer.

Next, another aspect of the present invention will be described.

The density of a semiconductor device has been improved significantly, and the size and linewidth of a semiconductor integrated circuit has been narrowed more and more.

Regarding semiconductor exposure apparatuses for transferring a circuit pattern onto a silicon wafer, for miniaturization of the pattern, the wavelength of exposure light used for the exposure process has to be shortened. Hence, the wavelength has been shortened, such as from g-line or I-line to a KrF laser, an ArF laser, an $F_2$ laser, and soft X-rays emitted from an SR (synchrotron radiation) ring.

Short-wavelength exposure light is attenuated largely in the atmosphere. Therefore, the exposure unit of an exposure apparatus is accommodated in a chamber, and the chamber interior is filled with a reduced pressure He ambience or a vacuum ambience in which attenuation of exposure light is small.

In process machines, on the other hand, where a process gas is different from the atmosphere or for prevention of oxidation of a resist on a wafer, an ambience different from the atmosphere or a vacuum ambience is used.

In such process machines, for conveyance of a substrate between a chamber (first process chamber) having a process station therein and a substrate supply station disposed in the atmosphere, a load-lock chamber (second process chamber) is used. The substrate to be processed may be a Si wafer or reticle. There are cases wherein a plurality of load-lock chambers are provided, for substrate loading and unloading.

Figure 21A:
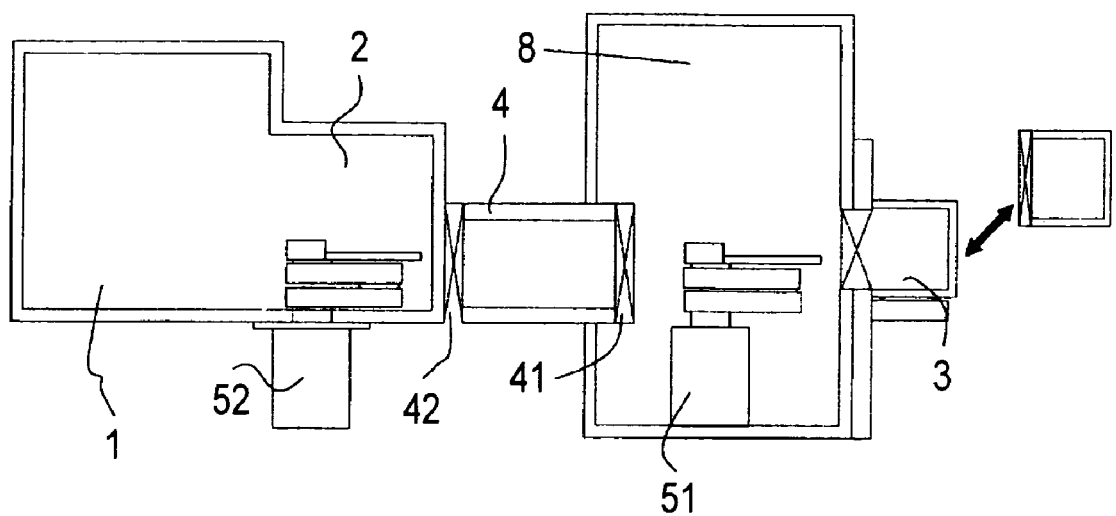
FIGS. 21A and 21B are schematic views of known type structures.
Figure 21B:
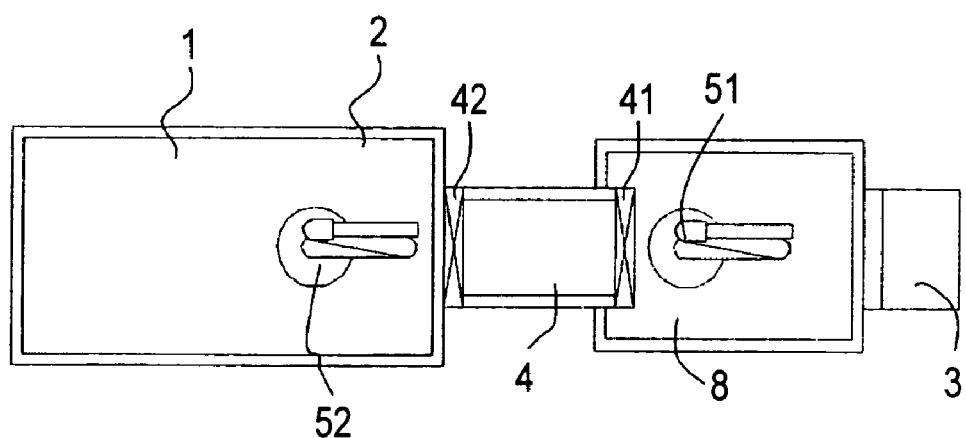

Here, referring to FIGS. 21A and 21B, an example of a known type of process machine, having a load-lock chamber 4, will be explained.

In the process machine illustrated, a process chamber having a substrate process station therein is filled with a reduce pressure He ambience.

In the atmosphere, there is a wafer carrier mounting portion (wafer supply unit) 3. Also, in the atmosphere, there is a first wafer carrier conveying means 51, which is able to access the carrier mounting portion 3 and the load-lock chamber 4.

The load-lock chamber 4 has a first gate valve 41 for intercepting the same from the wafer supply unit 3, a second gate valve 42 for intercepting the same from the process chamber, exhaust means (not shown) for exhausting the inside of the load-lock chamber 4, and gas supply means (not shown) for supplying He or $N_2$.

Additionally, the load-lock chamber 4 has a wafer mounting table, which is arranged to accommodate therein one or more wafers.

The operation of this known type of load-lock system will be explained below.

Initially, first conveying means 51 takes one wafer out of a wafer carrier mounted in the wafer carrier mounting portion 3, and it conveys the wafer into the load-lock chamber 4.

As the wafer is conveyed into the load-lock chamber 4, and is placed on the wafer mounting table, the first gate valve 41 is closed to intercept the chamber from the atmosphere, and then replacement of the inside ambience of the load-lock chamber 4 is carried out.

The inside ambience of the load-lock chamber 4 is carried out as follows.

As the first gate valve 41 is closed and the load-lock chamber is isolated from the atmosphere and the process chamber, a vacuum exhaust valve (not shown) is opened. Then, through a vacuum exhaust pipe and by means of a vacuum pump (not shown), the gas inside the load-lock chamber 4 is exhausted.

Vacuum evacuation is carried out until a predetermined vacuum level is reached. After the exhausting is carried out and the predetermined vacuum level is reached, the vacuum exhaust valve is closed, and vacuum evacuation is interrupted.

Subsequently, a gas supply valve (not shown) is opened. The load-lock system shown in the drawing is provided with a He gas supplying valve and an $N_2$ gas supplying valve. The valve opened here is the valve for supplying the same gas as the chamber ambience in which a process chamber is accommodated. Hence, the He gas supplying valve is opened.

The He gas is supplied until the pressure inside the load-lock chamber 4 becomes equal to the pressure inside the process chamber. As the pressure inside the load-lock chamber 4 becomes equal to the pressure inside the process chamber, the He gas supply valve is closed and the supply of He gas is turned off.

As the He gas supply is stopped, the second gate valve 42 is opened, and the wafer inside the process chamber is unloaded therefrom by second conveying means 52. The wafer is conveyed to a process station (not shown).

The wafer having been processed at the process station is conveyed by the second conveying means 52 and the first conveying means 51 by way of the load-lock chamber 4, and it is moved back into the wafer carrier 3.

Since the inside volume of the load-lock chamber 4 is constant, when the load-lock chamber 4 is evacuated, the gas inside the chamber causes adiabatic expansion and the temperature thereof decreases. Although it depends on various factors, including the exhaust, the temperature decrease of the inside gas maybe more than a few degrees and, depending on the condition, the temperature may decrease beyond the freezing point.

Since the substrate placed inside the load-lock chamber 4 is exposed to the gas inside the chamber, its temperature is lowered together with the cooling of the gas.

The substrate whose temperature has decreased with the adiabatic expansion inside the load-lock chamber 4 is loaded into the apparatus in response to the completion of ambience replacement.

In the exposure apparatus, the temperature of a substrate must be controlled precisely to keep the transfer precision, linewidth precision, and so on. However, the substrate conveyed through the load-lock chamber 4 has its temperature decreased as described above and, therefore, if the substrate is exposed in this state, it directly causes degradation of the transfer precision.

Conventionally, for controlling the wafer temperature at a predetermined temperature, an example is to wait for the substrate temperature to gradually come up to and become equal to a predetermined temperature, as the wafer contacts an ambient gas or substrate conveying means.

Another example is to provide a heater or any other heating means inside the apparatus to heat the substrate, thereby to prevent a temperature decrease of the substrate due to adiabatic expansion. There is a variation with respect to the location where the heater or heating means is provided, such as in the atmosphere, the load-lock chamber, the process chamber, and the like.

The former example is a simple method with respect to the apparatus structure. However, it takes a long time until a predetermined substrate temperature is reached, and the throughput is lowered undesirably.

The latter example has inconveniences, such that the apparatus structure is complicated due to the addition of heating means, that complicated control is necessary, and that heat from the heating means is transmitted to the apparatus to cause local deformation and, thus, degradation of the substrate conveyance position.

A temperature decrease of the gas and resultant temperature decrease of the substrate can be suppressed by slowing down the vacuum evacuation of the load-lock chamber 4.

More specifically, usually, the wall of the load-lock chamber 4 is made of metal, and it has a large heat capacity with regard to a wafer or a gas. Furthermore, since the outer wall of the load-lock chamber 4 is in contact with the atmosphere, even if the temperature is lowered, heat is applied from the atmosphere. Thus, it causes less of a temperature decrease. In other words, it is an equivalent to having a very large heat capacity.

The gas inside the load-lock chamber 4 is continuously in contact with the wall surface of the load-lock chamber. If the temperature of the gas is lower than the wall surface temperature, heat is applied to the gas from the wall surface. Furthermore, in addition to heat application due to direct contact, the gas receives heat by radiation from the wall surface. For this reason, if the vacuum evacuation is carried out slowly, the time in which the gas receives heat from the wall is prolonged, such that the total amount of heat received from the wall becomes larger. Thus, there is an advantage of less of a temperature decrease of the gas.

With this method, however, the time for vacuum evacuation has to be set extraordinarily long, and this causes a considerable decrease of the throughput.

As described above, in regard to the problem of a temperature decrease of the substrate, resulting from adiabatic expansion of the gas inside the load-lock chamber during vacuum evacuation, conventionally adopted methods in turn cause different inconveniences, such as decreased throughput, complicatedness of the structure, degraded substrate conveyance precision, and so on.

It is an object of the present invention in another aspect thereof to provide a substrate processing machine by which, in regard to a temperature decrease of a substrate due to adiabatic expansion inside a load-lock chamber during vacuum evacuation of the same, the inside volume of the load-lock chamber is maintained to be not greater than twenty times the volume of the substrate. With this arrangement, the temperature decrease of the substrate can be held to be not greater than 0.3° C. and, thus, a process, such as an exposure process, can be carried out to the substrate promptly after the substrate is loaded into a process chamber. An improved throughput is attainable thereby.

In accordance with one preferred form of the present invention, to solve at least one of the inconveniences described above, the inside volume of a load-lock chamber is set to be approximately not greater than ten times the volume of the substrate to be conveyed through the load-lock chamber.

In accordance with another aspect of the present invention, a holder, as well, is introduced into a load-lock chamber 4 together with a substrate. With the volume of this holder, an effect being equivalent to reducing the inside capacity of the load-lock chamber is obtainable and, on the basis of it, the capacity of the load-lock chamber can be made approximately not greater than ten times the volume of the substrate.

In accordance with another aspect of the present invention, the inside capacity of the load-lock chamber is made changeable and, after a substrate is loaded into the load-lock chamber is reduced, thereby to assure that the inside capacity of the load-lock chamber is approximately not greater than ten times the volume of the substrate.

The capacity of the load-lock chamber has a relation with the temperature decrease of the substrate inside the load-lock chamber 4. The smaller the capacity of the load-lock chamber is, the smaller the temperature decrease is.

Figure 20:
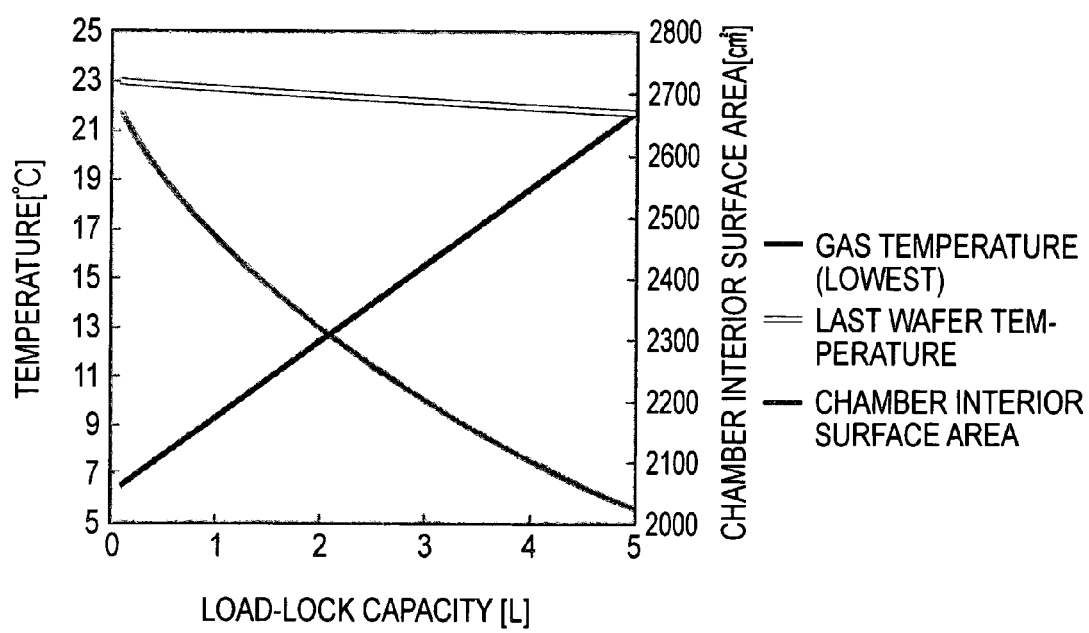
FIG. 20 is a graph for explaining the relationship between a load-lock capacity and a temperature decrease of a wafer.

For a load-lock chamber that accommodates a wafer of 300 mm therein, for example, it should have a floor area of about 320 (mm)×320 (mm)=102,400 mm². Based on this, calculates were made on the temperature decrease of a 300 mm wafer while changing the height of the load-lock chamber. The graph of FIG. 20 shows the results. In the calculation, the time required for exhausting was assumed to be constant.

A steeply increasing curve is the inner surface area of the chamber, and it is proportional to the load-lock capacity with a certain offset. On the other hand, the wafer temperature and the gas temperature inside the load-lock chamber are normally at 23° C., and they decrease with the capacity. Namely, the larger the load-lock chamber capacity is, the larger the temperature decrease is.

As far as the adiabatic expansion, which is a peculiar physical phenomenon concerns, the lowest gas temperature is determined only by the initial pressure and the final pressure independently of the capacity of the load-lock chamber, or the like. In practical load-locking, however, the gas inside the load-lock chamber is in contact with the wall of the load-lock chamber and the gas receives heat by contact. Generally, the load-lock chamber is made of metal, and the metal itself has a large heat capacity, as compared with the inside gas. Furthermore, the wall of the load-lock chamber is in contact with the atmosphere and, in this respect, it is equivalent to the chamber having a very large heat capacity as compared with the gas inside the chamber.

For these reasons, the gas inside the load-lock chamber causes a temperature decrease due to adiabatic expansion and, on the other hand, it receives heat from the load-lock chamber. The amount of heat to be received is proportional to the contact area and, hence, the larger the inner surface area of the load-lock chamber is, the larger the amount of heat received is.

However, if the floor area is taken to be constant, as described above, it is seen that the rate of change in the increase of chamber capacity is larger than that of the increase of area. This means that the increase of gas capacity is larger in proportion than the increase of heat quantity received. Hence, the smaller the load-lock chamber capacity is, the smaller the temperature decrease of the gas is.

A wafer is exposed to gas inside the load-lock chamber. Therefore, if the gas temperature decreases, the wafer is cooled thereby, and its temperature is lowered. Thus, a temperature decrease of the gas causes a temperature decrease of the wafer.

When an electrostatic chuck is used as a substrate holding unit of a substrate processing station, the temperature of the substrate when it is attracted to the chuck should be maintained in a range of 0.19° C., in terms of the temperature difference with the chuck. In order to keep the substrate temperature decrease not greater than 0.19° C., it is seen from FIG. 20 that the capacity of the load-lock chamber 4 should be 0.5 L. Since the size in thickness direction is 5 mm, and the volume is about 55,000 mm³ in the case of a 300 mm wafer, the load-lock chamber volume of 0.5 L means that, in terms of the substrate volume, the load-lock chamber volume should well be made approximately not greater than ten times the substrate volume.

In other words, by making the load-lock chamber capacity about ten times larger than the substrate volume, the temperature decrease of the substrate when the load-lock chamber 4 is vacuum evacuated can be made not greater than 0.19° C. Thus, the inconveniences of a substrate temperature decrease involved in the vacuum evacuation of the load-lock chamber can be solved without raising additional problems.

With the arrangement described above, a wafer loaded into the apparatus from the load-lock chamber is at a desired temperature at the moment the same is loaded. Hence, a process, such as an exposure process, can be done promptly after the loading and, thus, the precision and throughput, as well, are improved.

The present invention can be embodied in various forms. Examples can be summarized as follows.

(1) A reduced- or normal-pressure substrate processing apparatus comprising a first process chamber for performing a process in an ambience different from an atmosphere, and a second process chamber connected to the first process chamber and the atmosphere, respectively, through an opening/closing mechanism, wherein a substrate, which is an object to be processed, is going to be conveyed from the atmosphere to the first process chamber through the second process chamber, and wherein the second process chamber has an inside capacity, which is approximately not greater than ten times the volume of the substrate conveyed through the second process chamber.

(2) A reduced- or normal-pressure substrate processing apparatus comprising a first process chamber for performing a process in an ambience different from an atmosphere, and a second process chamber connected to the first process chamber and the atmosphere, respectively, through an opening/closing mechanism, wherein a substrate, which is an object to be processed, is going to be conveyed from the atmosphere to the first process chamber through the second process chamber, wherein the substrate is stored into a container as the same is in the atmosphere, wherein the container is sealingly closed in the atmosphere, wherein the container is conveyed to the first process chamber through the second process chamber, and wherein the capacity of the space inside the second process chamber as the container is being placed inside the second process chamber as the container is being placed inside the second process chamber is made approximately not greater than ten times the volume of the substrate conveyed.

(3) A reduced- or normal-pressure substrate processing apparatus comprising a first process chamber for performing a process in an ambience different from an atmosphere, and a second process chamber connected to the first process chamber and the atmosphere, respectively, through an opening/closing mechanism, wherein a substrate, which is an object to be processed, is going to be conveyed from the atmosphere to the first process chamber through the second process chamber, wherein a substrate storing container is provided while being movable into the second process chamber, wherein the substrate is stored into the container as the same is in the atmosphere, wherein the container is sealingly closed in the atmosphere, wherein the container is placed into the second process chamber and then the atmospheric ambience of the second process chamber is replaced by an ambience the same as that of the first process chamber, wherein the container is moved into the first process chamber and the substrate is then taken out of the container and conveyed to the first process chamber, and wherein the capacity of the space inside the second process chamber as the container is being placed inside the second process chamber is made approximately not greater than ten times the volume of the substrate conveyed.

(4) A reduced- or normal-pressure substrate processing apparatus comprising a first process chamber for performing a process in an ambience different from an atmosphere, and a second process chamber connected to the first process chamber and the atmosphere, respectively, through an opening/closing mechanism, wherein a substrate, which is an object to be processed, is going to be conveyed from the atmosphere to the first process chamber through the second process chamber, wherein the second process chamber is arranged to provide a variable capacity, and wherein the capacity of the second process chamber, as the substrate is being placed therein, is changeable to assure that the capacity of the second process chamber is approximately not greater than ten times the volume of the substrate conveyed.

(5) A substrate processing apparatus comprising a first process chamber for performing a process to an object to be process, in an ambience different from an atmosphere, a second process chamber connected to the first process chamber and the atmosphere, respectively, through an opening/closing mechanism, and conveying means for conveying the object from the atmosphere to the first process chamber through the second process chamber, wherein the capacity of the second process chamber is approximately not greater than ten times the volume of the object.

(6) An exposure apparatus including a substrate processing apparatus as discussed in any one of Items (1) to (5) above.

(7) An exposure apparatus including a substrate processing apparatus as discussed in any one of Items (1) to (5) above, and an optical system for directing light from a light source to the object to be processed.

(8) A device manufacturing method comprising the steps of exposing an object to be processed, by use of an exposure apparatus as discussed in Item (6) or (7), and developing the exposed object.

As regards the temperature decrease of the substrate due to adiabatic expansion inside the load-lock chamber during vacuum evacuation, the substrate temperature decrease can be held to be not greater than 0.3° C., if the capacity of the load-lock chamber is held to be not greater than twenty times the volume of the substrate. Hence, without using substrate temperature adjusting means, or the like, a process, such as an exposure process, can be performed to the substrate promptly after the same is introduced into the process chamber. Therefore, the throughput of the apparatus is improved significantly.

Preferred embodiments in this aspect of the present invention will be described below, in conjunction with the drawings.

Embodiment 3

Figure 10A:
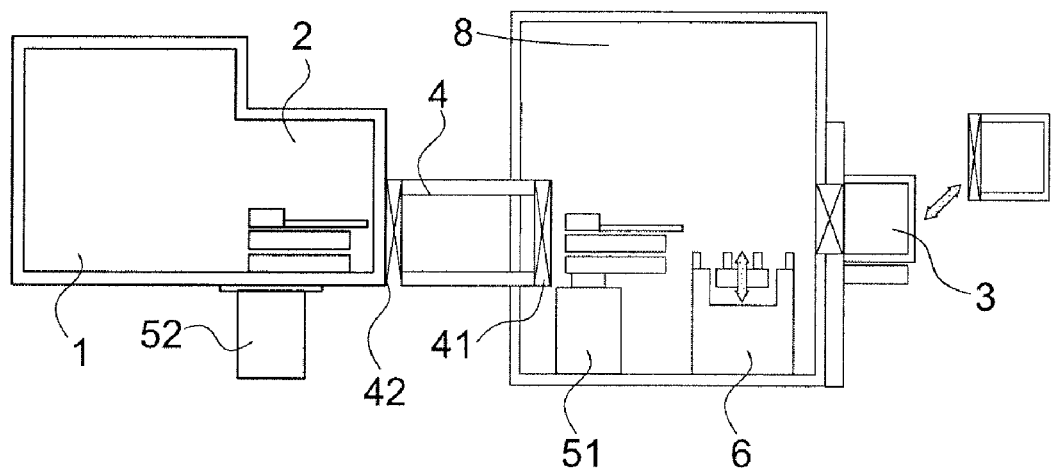
FIGS. 10A and 10B are schematic views, respectively, for explaining the structure of a third embodiment of the present invention.
Figure 10B:
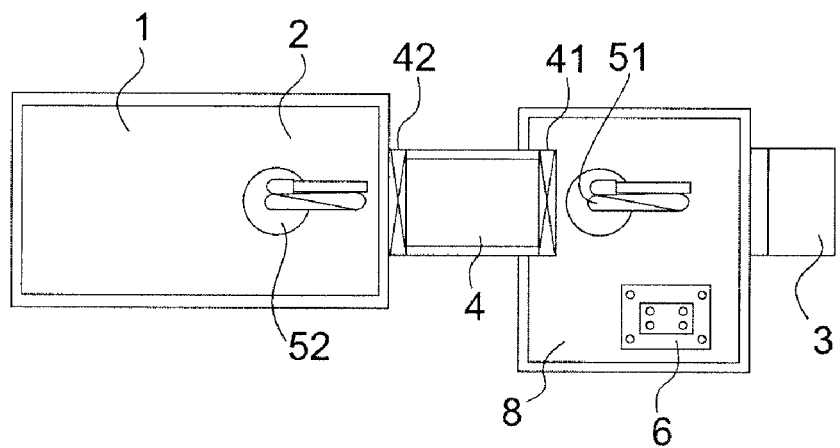

FIGS. 10A and 10B show a third embodiment of the present invention. In this embodiment, the invention is applied to an exposure apparatus. This embodiment comprises a process chamber 1 that accommodates therein a wafer exposure process unit, not shown, and a reduced pressure He ambience is created and kept therein. The apparatus further comprises a wafer carrier (wafer supply unit) 3, which is disposed in the atmosphere. In this embodiment, the wafer carrier 3 is a FOUP system. A chamber auxiliary room 2 is connected to the process chamber 1, and second conveying means 52, to be described later, is disposed in this chamber auxiliary room 2.

Disposed between the chamber auxiliary room 2 and the wafer supply unit 3 is a load-lock chamber 4 for allowing transfer of a wafer between different ambiences. The load-lock chamber 4 is communicated with the atmosphere and the chamber auxiliary room 2, respectively, through a first gate valve 41 and a second gate valve 42, respectively.

At the atmosphere side, there is first waver conveying means 51 for conveying a wafer between the wafer carrier 3 and the load-lock chamber 4. Inside the chamber auxiliary room 2, there is a second wafer conveying means 52 for conveying a wafer between the load-lock chamber 4 and a wafer processing unit, not shown. Disposed between the wafer carrier 3 in the atmosphere and the load-lock chamber 4, there is a caddy station 6 in which a wafer can be stored into a caddy 7.

Around the first wafer conveying means 51 and the caddy station 6, there is a mini clean booth 8. This clean booth 8 is structured to enclose the entirety of the wafer conveying unit in the atmosphere. In this connection, the load-lock chamber 4 has an atmosphere side opening, which opens to the inside of the clean booth 8. Also, as regards the wafer carrier 3, the FOUP system is attached to the wall of the clean booth 8 and, thus, the opening of the FOUP system faces the clean booth 8.

The first wafer conveying means 51 is structured to be able to access every one of load-lock chamber 4, wafer carrier 3 and caddy station 6. Specifically, in this embodiment, the load-lock chamber 4, the wafer carrier 3 and the caddy station 6 are disposed along a circumference, and a scalar robot is provided approximately at the center of the circle.

The caddy station 6 has a wafer elevating mechanism 63 for assisting storing a wafer on the first wafer conveying means into the caddy 7.

Figure 11:
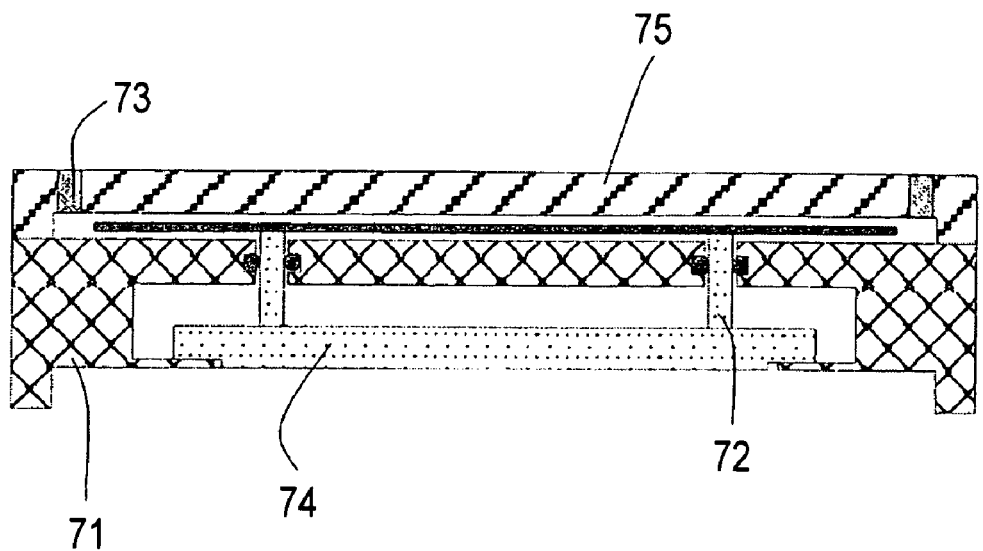
FIG. 11 is a schematic view for explaining the structure of a caddy according to the present invention.

The caddy 7 has a structure, such as shown in FIG. 11. The caddy 7 includes a main frame 71 having three pins 72 formed on the top surface thereof, and a wafer is to be placed on these pins. The bottom of the main frame 71 has a concaved shape so that a hand of the conveying means can be received and held there. The three pins 72 have a length slightly longer than the amount of flexure of a wafer to be caused by the weight of the wafer itself, as the same is placed on the pins, so as to prevent contact of the wafer held thereon with the base bottom face and also to assure a smallest space capacity.

The three pins 72 are provided on a base 74. The base 74 is mounted inside the caddy main frame 71, and it is made movable upwardly and downwardly relative to the caddy main frame. The three pins 72 extend through bores formed in the top of the caddy frame 71 to hold a wafer upon the caddy main frame 71. The clearance between each through-bore of the caddy main frame 71 and the pin 72 is gas-tightly sealed by seal means, such as an O-ring, for example.

A caddy cover 75 is openably and closably held by the caddy main frame 71. The surface of the caddy cover 75, facing the caddy main frame 71, is formed with a concaved shape of a size that can accommodate a wafer. Furthermore, the caddy cover 75 has appropriate bores formed therein to allow passage of gases therethrough, and each bore is provided with a filter 73 equivalent to an ULPA filter. Preferably, the bores of the caddy cover 75 should be formed at peripheral positions, stepping aside the wafer underneath.

Figure 12:
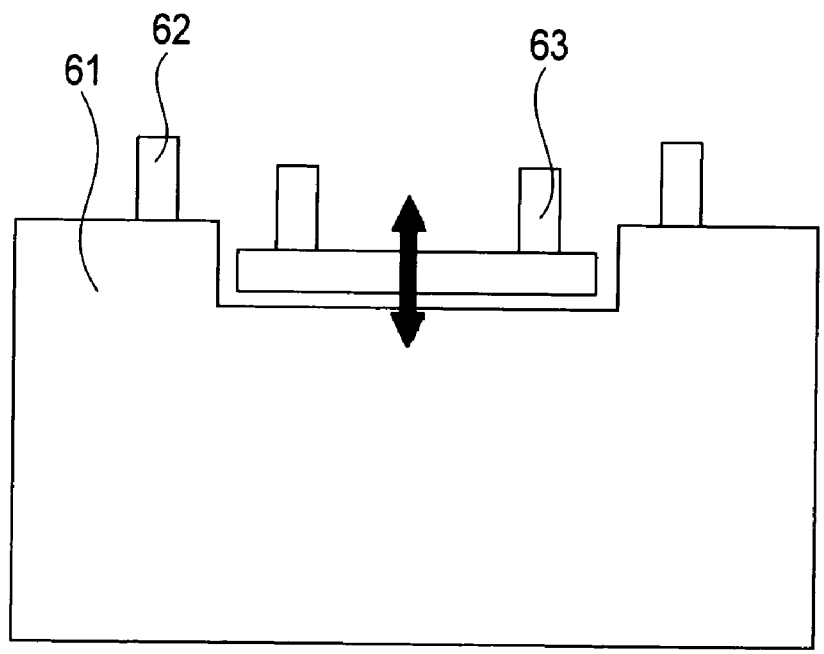
FIG. 12 is a schematic view for explaining the structure of a caddy station according to the present invention.
Figure 13A:
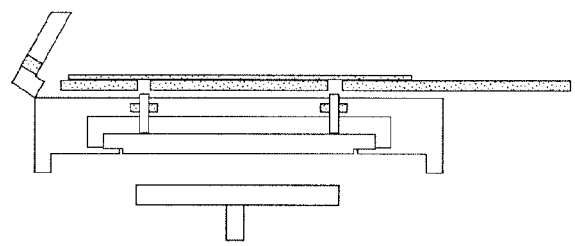
FIGS. 13A–13E are schematic views for explaining the operation for storing a wafer into a caddy of the present invention.
Figure 13B:
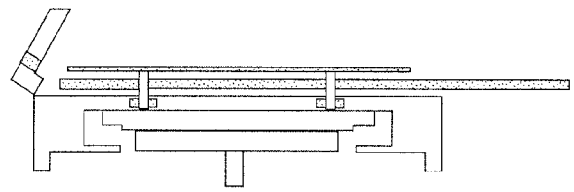
Figure 13C:
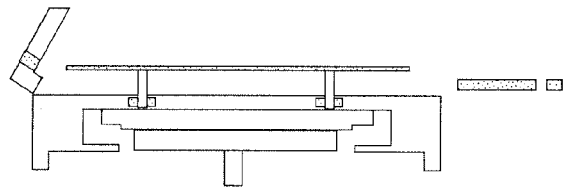
Figure 13D:
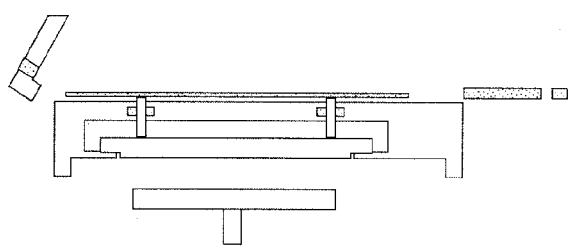
Figure 13E:
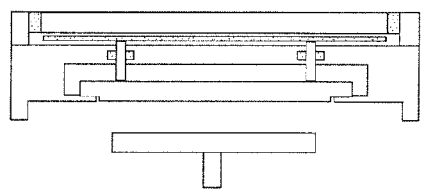
Figure 14A:
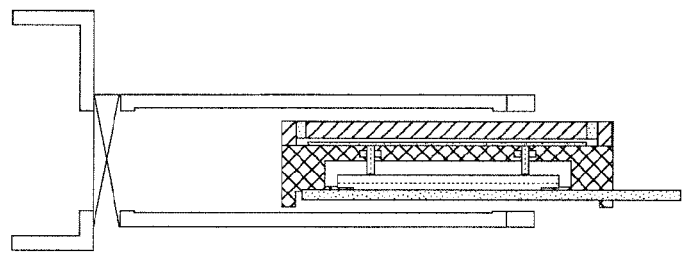
FIGS. 14A–14E are schematic views for explaining the operation for loading a caddy of the present invention into a load-lock chamber 4.
Figure 14B:
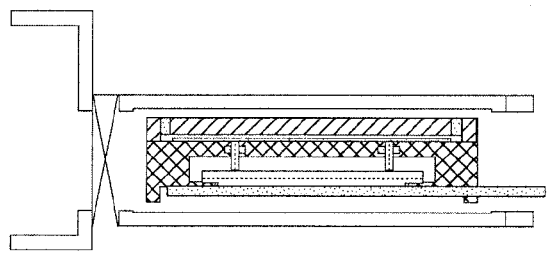
Figure 14C:
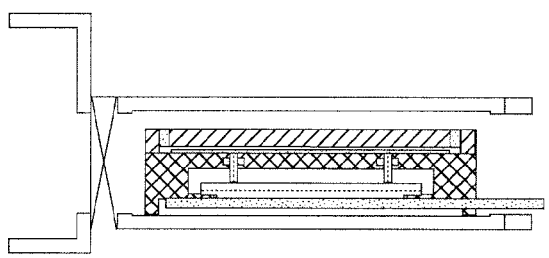
Figure 14D:
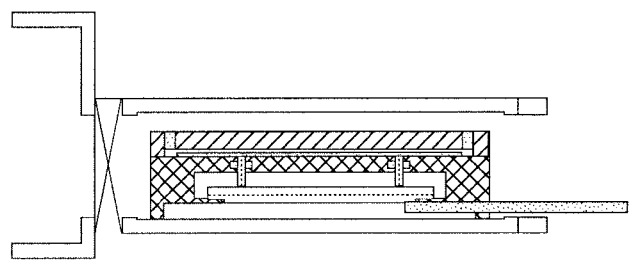
Figure 14E:
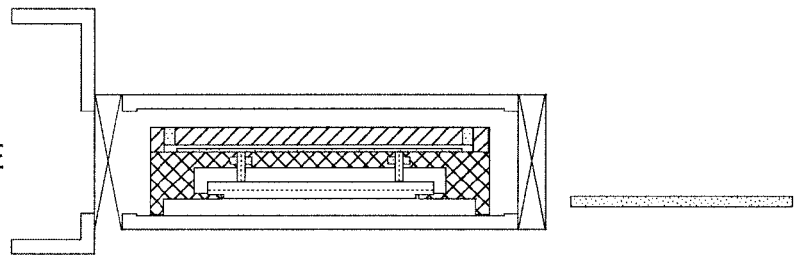

FIG. 12 shows an example of the structure of the caddy station 6. The caddy station 6 comprises a main frame 61, a caddy mounting table 62 and wafer elevating means 63.

The caddy mounting table 62 is provided to hold a caddy at a predetermined position when a wafer is to be stored therein or to be taken out therefrom. It comprises three pins on which a caddy can be placed. These pins may have a structure for holding a caddy by attraction. Furthermore, the caddy mounting table may be provided with positioning pins for positioning a caddy or drift preventing pins for avoiding displacement of the caddy when a wafer is stored into or pulled from the caddy. In the drawing, a simplest structure only having mounting pins is illustrated.

The wafer elevating mechanism 63 is made movable in upward and downward directions. Regarding a guide and a drive source for the movement, for example, any known structure may be used. In the drawing, a simplest example using upwardly and downwardly movable pins is illustrated.

As a caddy is placed on the caddy mounting table 62, the pins of the wafer elevating mechanism 63 are opposed to the base 74 of the caddy. As the wafer elevating mechanism 63 moves upwardly, the pins engage with the bottom face of the base 74. With further upward motion of the elevating mechanism 63, the base 74 moves upwardly relative to the caddy main frame 71.

A wafer can be stored into the caddy 7 in the manner as shown in FIGS. 13A–13E.

Initially, the first wafer conveying means 51 having a wafer held thereon stretches its arm out to convey the wafer up to a predetermined position above the caddy station 6. Subsequently, the wafer elevating mechanism 63 of the caddy station 6 moves upwardly to raise the base 74 of the caddy 7. With this motion, the pins 72 mounted on the base 74 move upwardly and they are brought into engagement with the wafer on the hand. With further upward motion of the pins, the wafer is lifted away from the hand of the first conveying means.

The first conveying means 51 retracts its arm and the hand is withdrawn, and then the wafer elevating mechanism 63 moves downwardly while holding the wafer thereon. The wafer moves downwardly with this motion. As the base 74 of the caddy is lowered to a predetermined position of the caddy main frame 71, the wafer elevating means 63 moves away from the base 74, and it continues the downward motion and finally, it is retracted.

After the wafer is placed on the wafer mounting pins 72 of the caddy 7 and the wafer elevating means 63 is retracted, the caddy cover 75 is closed.

With the sequences described above, the procedure for storing a wafer into a caddy is completed.

Next, the wafer conveying operation in an exposure apparatus according to this embodiment of the present invention will be described.

The first conveying means 51 enters a wafer carrier 3 placed in the atmosphere, and it takes one wafer out of the carrier. The first conveying means 51 now carrying one wafer thereon retracts its arm, and the state of the caddy station 6, as well as the state of a caddy 7 upon the caddy station, are checked.

If the caddy 7 is ready for receiving a wafer, the first wafer conveying means 51 turns its arm toward the caddy 7 and then stores the wafer into the caddy 71 in the manner described hereinbefore.

After the wafer is stored into the caddy 7, the first wafer conveying means 51 enters the caddy station 6 once more. Here, the hand of the first wafer conveying means 51 is arranged to hold both of a wafer singly and a caddy.

Specifically, the first wafer conveying means 51 enters the caddy station 6, with its position kept lower than the position thereof when it stored one wafer into the caddy 7 a little while ago and, also, lower than the bottom face of the caddy 7. After the hand approaches to be underneath the caddy 7, the first wafer conveying means 51 moves upwardly to lift the caddy 7 from the caddy station 6.

While holding the caddy 7 thereon, the first wafer conveying means 51 retracts its arm. Then, the ambience of the load-lock chamber 4 is checked.

If the load-lock chamber 4 is filled with an atmospheric ambience at this time, the caddy 7 is loaded into the load-lock chamber in accordance with the sequences illustrated in FIGS. 14A–14E. The first conveying means 51 rotates and turns its arm toward the load-lock chamber 4. After checking the open state of the gate valve 41, the first conveying means stretches the arm out and it conveys the caddy 7 having a wafer held thereon into the load-lock chamber 4.

Subsequently, the first wafer conveying means 51 moves its arm downwardly. Thus, the mount portion of the caddy 7 engages with the bottom of the load-lock chamber 4, and the caddy is mounted there. Even after the caddy 7 is mounted in the load-lock chamber 4, the first wafer conveying means 51 continues the motion for lowering its arm and, as the arm moves away from the bottom of the caddy 7 and it reaches a position enabling arm retraction, the downward motion is stopped.

Thereafter, the first wafer conveying means 51 draws its arm to retract the hand from the load-lock chamber 4. After the wafer conveying means 1 is retracted, the interface with the atmosphere is intercepted by the first gate valve 41, and ambience replacement is carried out subsequently.

The ambience replacement can be done as follows.

After the first gate valve 41 is closed, a vacuum exhaust valve (not shown) is opened and, then, exhausting of the gas inside the load-lock chamber 4 is initiated by use of vacuum exhausting means (not shown). As the gas is exhausted and a predetermined vacuum level is reached, the vacuum exhaust valve is closed and, thus, the exhausting is completed.

Subsequently, He gas, the same as the inside ambience gas of the process chamber 1, is supplied into the load-lock chamber 4, by opening a gas supply valve of gas supplying means (not shown). When a reduced pressure He ambience approximately at the same pressure level as that of the process chamber 1 is created inside the load-lock chamber 4, the gas supply valve is closed and the supply of He gas is turned off.

Here, the pressure is compared between the process chamber 1 and the load-lock chamber 4. If a pressure difference between these chambers is larger than a predetermined value, a pressure correcting operation is carried out. Depending on the apparatus structure, the pressure correcting operation can be performed in various manners.

One example is that a communication pipe is provided between the process chamber 1 and the load-lock chamber 4, and a cutoff valve is provided in a portion of the pipe. When the pressure difference between the process chamber 1 and the load-lock chamber 4 is larger than a predetermined value, the cutoff valve in the communication pipe is opened to provide fluid communication between the process chamber 1 and the load-lock chamber 4. Basically, the pressure difference can be removed by this, and the ambient replacement operation for the load-lock chamber 4 is thus finished.

Another method is that vacuum evacuation or ambience gas supply for the load-lock chamber 4 is carried out again, to produce a predetermined pressure. More specifically, if the pressure of the load-lock chamber 4 is higher than that of the process chamber 1, the vacuum exhaust valve is opened to perform vacuum evacuation. As a predetermined pressure level is reached, the vacuum exhaust valve is closed, and exhausting is stopped. If, on the other hand, the pressure inside the load-lock chamber is lower than the process chamber pressure, the He gas supply valve is opened to supply He gas until a predetermined pressure level is reached. As the pressure difference becomes smaller than the predetermined value as a result of gas exhausting or gas supplying, the ambience replacement operation for the load-lock chamber 4 is completed.

After the ambience replacement of the load-lock chamber 4 is finished, the second gate valve 42 is opened, and the second conveying means 52 enters the load-lock chamber 4 to unload the caddy 7 out of the load-lock chamber 4 in accordance with the sequences inverse to the loading sequences.

The second wafer conveying means 52 conveys the caddy 7 onto the caddy station (not shown) inside the process chamber 1. At the caddy station with the process chamber 1, the wafer is taken out from the caddy 7 in accordance with the sequences inverse to those made at the caddy station 6 in the atmosphere. Thus, the wafer is held by the second wafer conveying means 52 and is conveyed onto the process station.

At this stage, the wafer temperature has already reached a predetermined temperature. Hence, a subsequent wafer process can be initiated promptly.

In this embodiment, since a wafer is stored in a caddy 7, there is no possibility of particle adhesion during wafer loading and unloading of the load-lock chamber 4. This is a notable advantage because, conventionally, ambience replacement of a load-lock chamber involves a problem of particle adhesion. More particularly, due to the flow of gas during substrate loading and unloading, particles being present in the floor or side wall surface of the load-lock chamber are scattered and they are adhered to the wafer surface.

There is another problem that, while moisture content of the gas is frozen by cooling of the gas during exhausting, fine particles contained in the gas as well are collected by this freezing into large-size particles and adhered to the wafer.

In accordance with this embodiment of the present invention, as compared therewith, since the wafer is kept stored in a caddy 7 and, during the vacuum exhausting, only the gas inside the caddy is exhausted outwardly of the caddy, the wafer is not exposed to the gas inside the load-lock chamber. In the gas supply, on the other hand, since a filter is provided at the gas low port of the caddy, any particles scattered inside the load-lock chamber 4 can be caught by this filter, and they do not enter the caddy. With this arrangement, therefore, even if particles are scattered during gas supply or gas exhaust of the load-lock chamber 4, adhesion of particles onto the wafer can be prevented effectively.

Although many proposals have been made to avoid particle adhesion during substrate loading and unloading of the load-lock chamber, such as controlling gas supply or gas exhaust, for example, this embodiment can be free from particle adhesion without relying on any of them.

Embodiment 4

Figure 15:
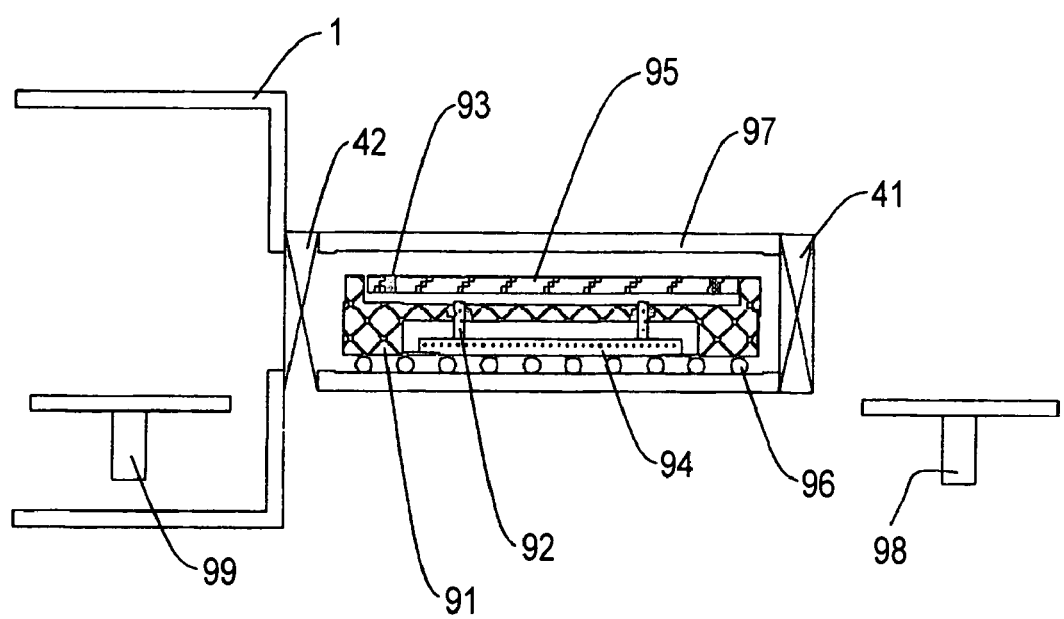
FIG. 15 is a schematic view for explaining the structure of a fourth embodiment of the present invention.
Figure 16A:
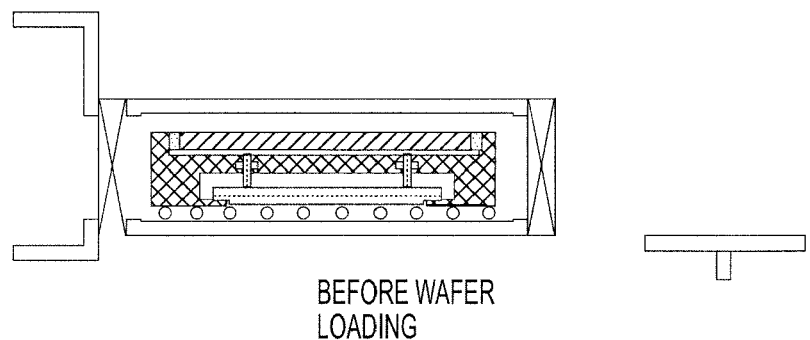
FIGS. 16A–16F are schematic views for explaining the operation for storing a wafer into a caddy-like structure in the fourth embodiment of the present invention.
Figure 16B:
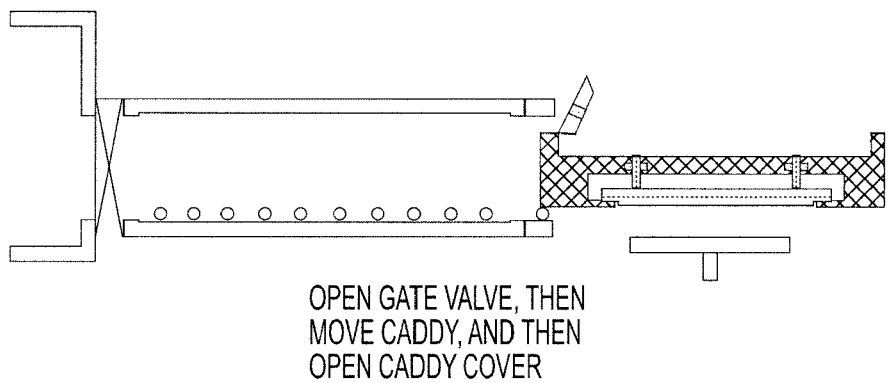
Figure 16C:
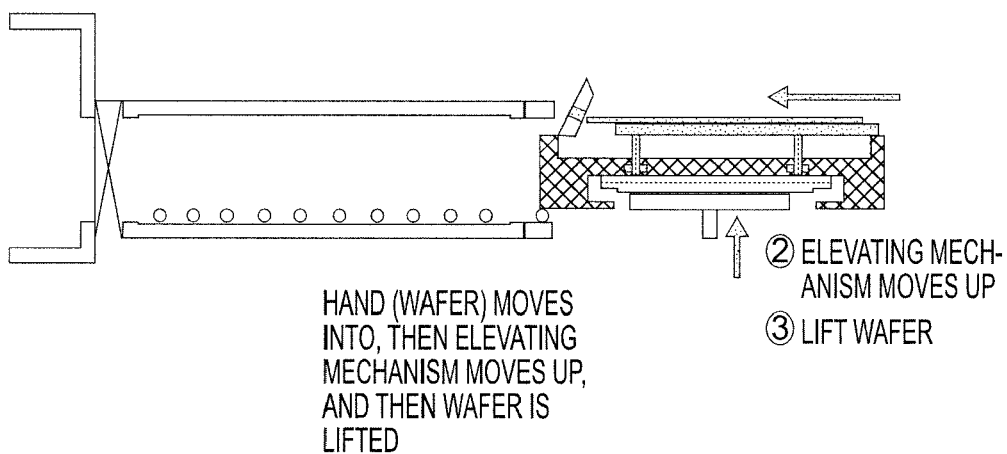
Figure 16D:
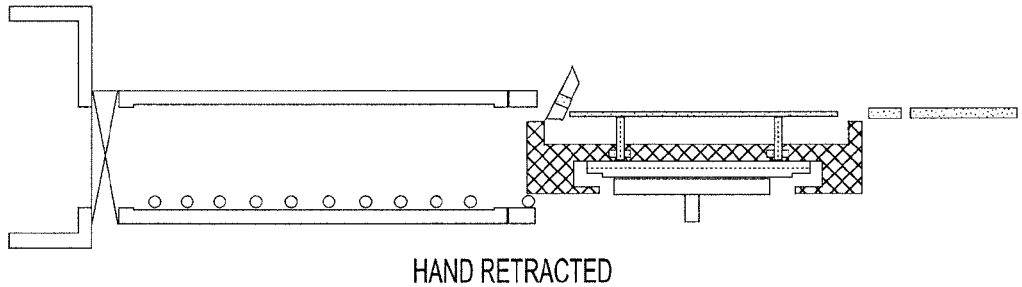
Figure 16E:
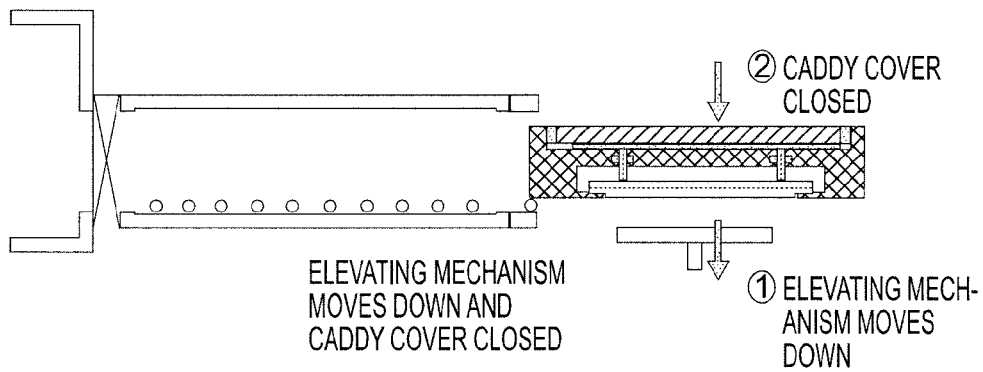
Figure 16F:
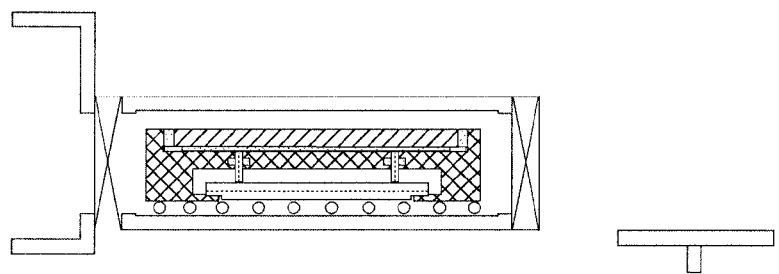
Figure 17A:
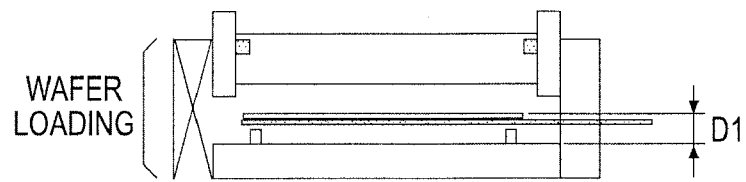
FIGS. 17A–17G are schematic views for explaining the operation of a fifth embodiment of the present invention.
Figure 17B:
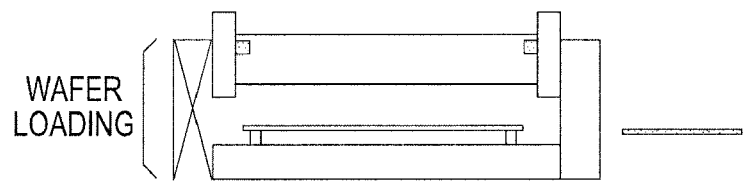
Figure 17C:
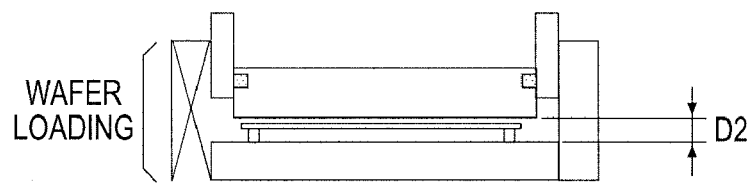
Figure 17D:
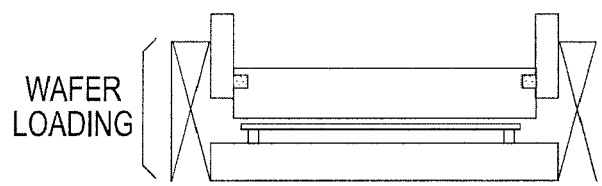
Figure 17E:
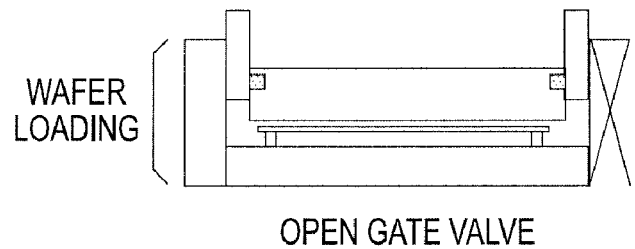
Figure 17F:
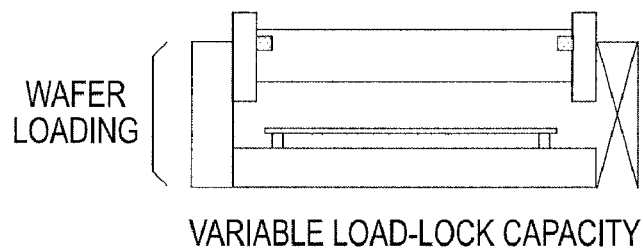
Figure 17G:
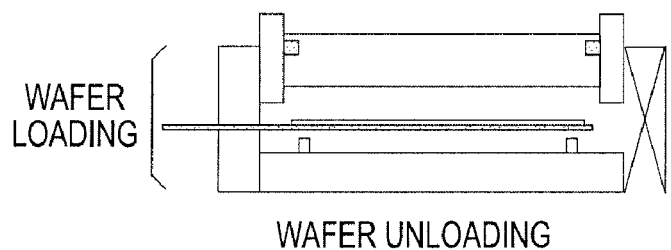

FIG. 15 shows an example of a structure according to a fourth embodiment of the present invention, and FIGS. 16A–16F illustrate the operation according to this embodiment.

In this embodiment, a caddy-like structure for accommodating a wafer therein is provided inside a load-lock chamber 4. On the other hand, in the atmosphere, there are a wafer carrier (wafer supply unit) 3 and first wafer conveying means 51 for conveying a wafer between the wafer carrier 3 and the load-lock chamber 4. There is no caddy station as in the third embodiment. The remaining portion of this embodiment is essentially the same as that of the third embodiment.

The caddy-like structure 9 is disposed inside the load-lock chamber 4, and it is made movable from the load-lock chamber 4 to the atmosphere side and the process chamber side, respectively, through a first gate valve 41 and a second gate valve 42, respectively, while being supported by a sliding mechanism 96. The caddy-like structure 9 has an openable and closable cover 95 at the top thereof.

Disposed at the sides of the load-lock chamber 4, that is, at the atmosphere side and the process chamber side, are a first wafer elevating mechanism 98 and a second wafer elevating mechanism 99. The basic caddy structure of the other portion is essentially the same as that of the third embodiment.

In FIGS. 16A–16F, a wafer is stored into the caddy-like structure 9 as follows.

While the load-lock chamber 4 is kept open to the atmosphere, the atmosphere-side first gate valve 41 is opened. The caddy-like structure 9 moves outwardly of the load-lock chamber 4 while being supported by the sliding mechanism 96, and the cover 95 is opened. Then, the first wafer conveying means 51 having a wafer held thereon stretches its arm out to convey the wafer up to a predetermined position above the caddy-like structure 9.

Subsequently, the first wafer elevating mechanism 98 of the caddy-like structure 9 moves upwardly, to lift a wafer mounting portion 92 of the caddy-like structure together with a base 94. The thus lifted wafer mounting portion 92 raises the wafer off the hand of the first wafer conveying means 51. As the first wafer conveying means 51 retracts its arm and withdraws its hand, the first wafer elevating mechanism 98 moves downwardly. With this motion, the wafer mounting portion 92 is lowered while the wafer is held thereon. With this motion, the wafer, as well, is lowered, and when the wafer mounting portion 92 engages the caddy main frame 91 and stops there, the wafer elevating mechanism 92 moves away from the wafer mounting portion 92, and it continues downward motion, and, finally, it is retracted.

As the wafer elevating mechanism 98 is withdrawn, the cover 95 of the caddy-like structure 9 is closed. After this, the caddy-like structure 9 moves into the load-lock chamber 4 while being supported by the sliding mechanism 96, and then the first gate valve 41 is closed.

With the sequences described above, the procedure for loading a wafer into the caddy-like structure 9 is completed.

A wafer can be unloaded from the caddy-like structure 9 as follows.

Initially, whether the pressure difference between the load-lock chamber 4 and the process chamber is not greater than a predetermined value is checked and, if it is confirmed, the second gate valve 42 between the process chamber 1 and the load-lock chamber 4 is opened. Then, the caddy-like structure 9 moves outwardly of the load-lock chamber 4 while being supported by the sliding mechanism 96, and the cover 95 is opened. Subsequently, the second wafer elevating mechanism 99 of the caddy-like structure 9 moves upwardly to lift the wafer mounting portion 92 of the caddy-like structure, as well as the wafer thereon, together with the base 94.

Then, the second wafer conveying means 51 stretches its arm out, and the hand thereof approaches to a predetermined position below the wafer. The second wafer elevating mechanism 99 moves downwardly and the wafer is placed on the hand of the second wafer conveying means 52. Then, the wafer mounting portion 92 moves away from the wafer, and it is lowered together with the second wafer elevating mechanism 99, and is retracted. The second wafer conveying means 52 having a wafer placed on its hand then conveys the wafer onto the process station, not shown.

Next, the wafer conveying operation in an exposure apparatus according to this embodiment of the present invention will be described.

The first conveying means 51 enters a wafer carrier 3 placed in the atmosphere, and it takes one wafer out of the carrier. The first conveying means 51 now carrying one wafer thereon retracts its arm, and the state of the load-lock chamber 4 and the caddy-like structure 9 is checked.

If the load-lock chamber 4 has an atmospheric inside ambience and the caddy-like structure 9 is ready for receiving a wafer, the first wafer conveying means 51 turns its arm toward the load-lock chamber 4 and then stores the wafer into the caddy-like structure 9 in the manner described hereinbefore.

After the wafer is stored into the caddy-like structure 9, the first gate valve 41 is closed and then the ambience replacement of the load-lock chamber is carried out.

The ambience replacement can be done as follows.

After the first gate valve 41 is closed, a vacuum exhaust valve (not shown) is opened and, then, exhausting of the gas inside the load-lock chamber 4 is initiated by use of vacuum exhausting means (not shown). As the gas is exhausted and a predetermined vacuum level is reached, the vacuum exhaust valve is closed and, thus, the exhausting is finished.

Subsequently, He gas the same as the inside ambience gas of the process chamber 1 is supplied into the load-lock chamber 4, by opening a gas supply valve of gas supplying means (not shown). When a reduced pressure He ambience approximately at the same pressure level as that of the process chamber 1 is created inside the load-lock chamber 4, the gas supply valve is closed and the supply of He gas is turned off.

Here, the pressure is compared between the process chamber 1 and the load-lock chamber 4. If a pressure difference between these chambers is larger than a predetermined value, a pressure correcting operation is carried out. Depending on the apparatus structure, the pressure correcting operation can be performed in various manners.

One example is that a communication pipe is provided between the process chamber 1 and the load-lock chamber 4, and a cutoff valve is provided in a portion of the pipe. When the pressure difference between the process chamber 1 and the load-lock chamber 4 is larger than a predetermined value, the cutoff valve in the communication pipe is opened to provide fluid communication between the process chamber 1 and the load-lock chamber 4. Basically, the pressure difference can be removed by this, and the ambience replacement operation for the load-lock chamber 4 is thus finished.

Another method is that vacuum evacuation or ambience gas supply for the load-lock chamber 4 is carried out again, to produce a predetermined pressure. More specifically, if the pressure of the load-lock chamber 4 is higher than that of the process chamber 1, the vacuum exhaust valve is opened to perform vacuum evacuation. As a predetermined pressure level is reached, the vacuum exhaust valve is closed, and exhausting is stopped. If, on the other hand, the pressure inside the load-lock chamber is lower than the process chamber pressure, the He gas supply valve is opened to supply He gas until a predetermined pressure level is reached. As the pressure difference becomes smaller than the predetermined value as a result of gas exhausting or gas supplying, the ambience replacement operation for the load-lock chamber 4 is completed.

After the ambience replacement of the load-lock chamber 4 is finished, the second gate valve 42 is opened, and the second conveying means 52 unloads the wafer out of the caddy-like structure 9 in the manner described hereinbefore, and the wafer is conveyed onto the process station, not shown.

At this stage, the wafer temperature has already reached a predetermined temperature. Hence, a subsequent wafer process can be initiated promptly.

Embodiment 5

FIGS. 17A–17G illustrate a fifth embodiment of the present invention. In this embodiment, a load-lock chamber 4 is structured to provide a variable inside capacity. The remaining portion of this embodiment has a similar structure as that of the fourth embodiment.

When the first wafer conveying means 51 or the second wafer conveying means 52 enters the load-lock chamber 4 while holding a wafer thereon, it should approach while keeping its height higher than the level of the wafer holding portion inside the load-lock chamber 4. Thus, in this case, the height of the ceiling of the load-lock chamber 4 should be sufficiently large as compared with the height D1.

However, in order to make the load-lock chamber capacity a few times larger than the wafer volume, the height of the ceiling should be made not greater than D2 and, thus, generally D1>D2.

In consideration of this, in this embodiment, the ceiling of the load-lock chamber 4 is made movable in upward and downward directions. Simply, the ceiling may be provided with a piston-like structure.

Next, referring to FIGS. 17A–17G, the wafer conveying operation in an exposure apparatus according to this embodiment of the present invention will be described.

The first conveying means 51 enters a wafer carrier 3 placed in the atmosphere, and it takes one wafer out of the carrier. The first conveying means 51 now carrying one wafer thereon retracts its arm, and the state of the load-lock chamber 4 is checked.

If the load-lock chamber 4 has an atmospheric inside ambience and the distance between the ceiling and the floor of the load-lock chamber 4 is not less than D1, the first wafer conveying means 51 turns its arm toward the load-lock chamber 4. After checking that the first gate valve 41 is open, it stretches the arm and load the wafer into the load-lock chamber 4.

Subsequently, the first wafer conveying means 51 moves its arm downwardly. The wafer is moved onto the wafer mounting portion inside the load-lock chamber 4. The arm further moves downwardly and, as the hand disengages from the wafer bottom face and it reaches a position enabling hand retraction, the downward motion is stopped.

Thereafter, the first wafer conveying means 51 draws its arm to retract the hand from the load-lock chamber 4. After the hand is retracted from the load-lock chamber 4, then the load-lock chamber capacity reducing operation is carried out. Namely, while the first gate valve 41 is kept open, the ceiling of the load-lock chamber 4 having a piston-like structure gradually moves downwardly and, when the distance to the floor of the load-lock chamber becomes equal to D2, the motion is stopped.

After changing the load-lock chamber capacity described above, the communication with the atmosphere is intercepted by the first gate valve 41 and, then, the ambience replacement is carried out.

The ambience replacement can be done as follows.

After the first gate valve 41 is closed, a vacuum exhaust valve (not shown) is opened and, then, exhausting of the gas inside the load-lock chamber 4 is initiated by use of vacuum exhausting means (not shown). As the gas is exhausted and a predetermined vacuum level is reached, the vacuum exhaust valve is closed and, thus, the exhausting is completed.

Subsequently, He gas the same as the inside ambience gas of the process chamber 1 is supplied into the load-lock chamber 4, by opening a gas supply valve of gas supplying means (not shown). When a reduced pressure He ambience approximately at the same pressure level as that of the process chamber 1 is created inside the load-lock chamber 4, the gas supply valve is closed and the supply of He gas is turned off.

Here, the pressure is compared between the process chamber 1 and the load-lock chamber 4. If a pressure difference between these chambers is larger than a predetermined value, a pressure correcting operation is carried out. Depending on the apparatus structure, the pressure correcting operation can be performed in various manners.

One example is that a communication pipe is provided between the process chamber 1 and the load-lock chamber 4, and a cutoff valve is provided in a portion of the pipe. When the pressure difference between the process chamber 1 and the load-lock chamber 4 is larger than a predetermined value, the cutoff valve in the communication pipe is opened to provide fluid communication between the process chamber 1 and the load-lock chamber 4. Basically, the pressure difference can be removed by this, and the ambience replacement operation for the load-lock chamber 4 is thus finished.

Another method is that vacuum evacuation or ambience gas supply for the load-lock chamber 4 is carried out again, to produce a predetermined pressure. More specifically, if the pressure of the load-lock chamber 4 is higher than that of the process chamber 1, the vacuum exhaust valve is opened to perform vacuum evacuation. As a predetermined pressure level is reached, the vacuum exhaust valve is closed, and exhausting is stopped. If, on the other hand, the pressure inside the load-lock chamber is lower than the process chamber pressure, the He gas supply valve is opened to supply He gas until a predetermined pressure level is reached. As the pressure difference becomes smaller than the predetermined value as a result of gas exhausting or gas supplying, the ambience replacement operation for the load-lock chamber 4 is completed.

After the ambience replacement of the load-lock chamber 4 is finished, the second gate valve 42 is opened. As the second gate valve 42 is opened and the load-lock chamber 4 is communicated with the process chamber 1, the ceiling of the load-lock chamber 4 starts upward motion. As the distance between the ceiling and the floor surface becomes equal to D2, the motion is stopped.

Subsequently, the second conveying means 52 enters the load-lock chamber 4 to unload the wafer out of the load-lock chamber 4. The second wafer conveying means 52 holds the wafer and conveys it onto a process station, not shown.

At this stage, the wafer temperature has already reached a predetermined temperature. Hence, a subsequent wafer process can be initiated promptly.

This embodiment may be modified as follows.

Figure 18:
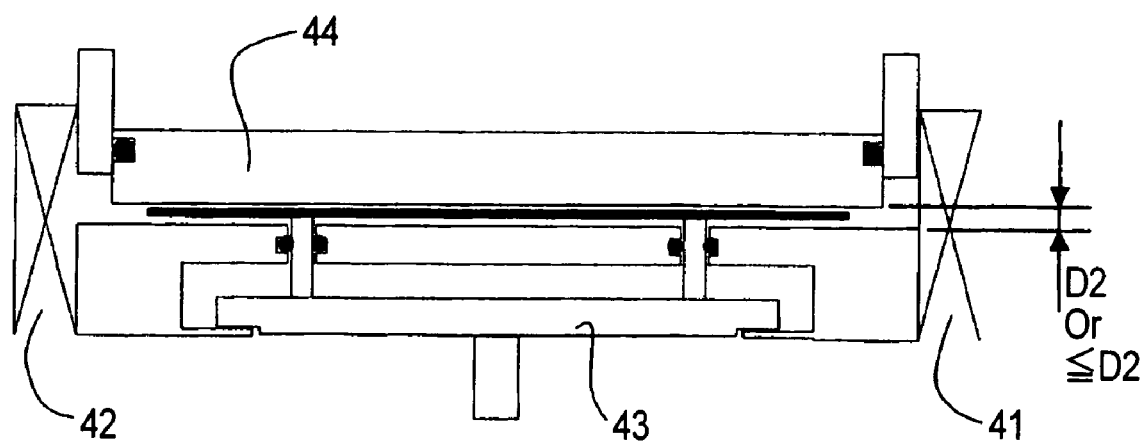
FIG. 18 is a schematic view for explaining another example of the structure according to the fifth embodiment of the present invention.
Figure 19A:
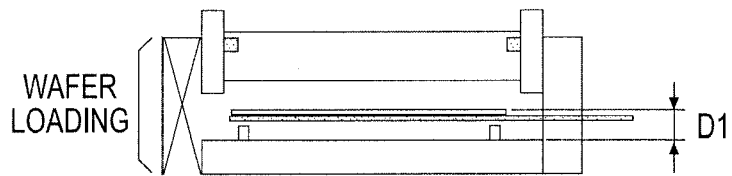
FIGS. 19A–19G are schematic views for explaining the operation of a sixth embodiment of the present invention.
Figure 19B:
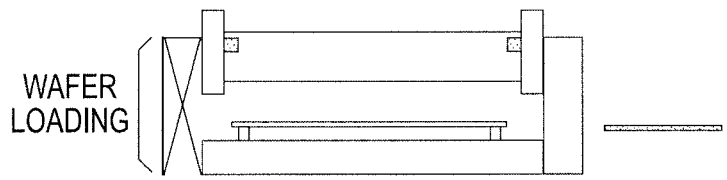
Figure 19C:
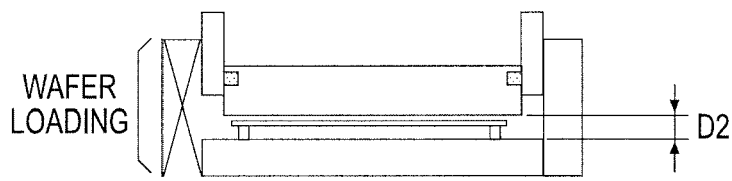
Figure 19D:
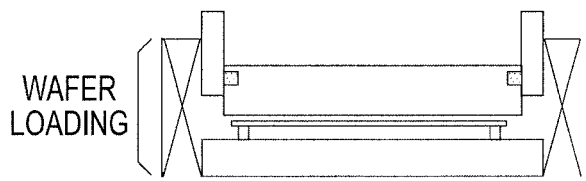
Figure 19E:
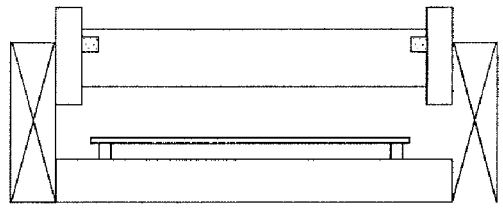
Figure 19F:
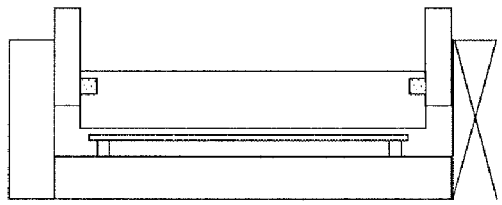
Figure 19G:
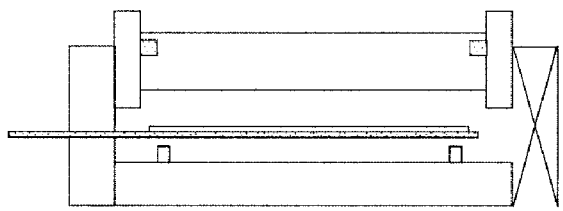

Namely, a shown in FIG. 18, the wafer mounting portion of the load-lock chamber 4 may be made movable upwardly or downwardly. For wafer loading and unloading, the wafer mounting portion is raised to allow transfer of the wafer between the first wafer conveying means 51 and the second wafer conveying means 52. After receiving the wafer, the wafer mounting portion is lowered. Here, the wafer mounting portion moves downwardly up to its lowest position where the wafer is still kept out of contact with the floor of the load-lock chamber. Thereafter, the ceiling of the load-lock chamber 4 moves downwardly until the distance to the load-lock chamber floor become equal to or less than D2. Here, the ceiling of the load-lock chamber 4 is lowered up to its lowest position, where it is still kept out of contact with the wafer top face.

Operations, such as an ambience replacement operation, may be performed essentially in the same manner as has been described hereinbefore.

As described, with the structure that the wafer mounting portion inside the load-lock chamber 4 is made to be movable up and down, the capacity of the load-lock chamber 4 can be made much smaller and, hence, the temperature decrease of the wafer due to adiabatic expansion during vacuum evacuation can be reduced.

Embodiment 6

A sixth embodiment of the present invention will now be described. This embodiment has a similar structure as that of the fifth embodiment, and the load-lock chamber is arranged to provide a variable inside capacity.

Next, referring to FIGS. 19A–19G, the wafer conveying operation in an exposure apparatus according to this embodiment of the present invention will be described.

The first conveying means 51 enters a wafer carrier 3 placed in the atmosphere, and it takes one wafer out of the carrier. The first conveying means 51 now carrying one wafer thereon retracts its arm, and the state of the load-lock chamber 4 is checked.

If the load-lock chamber 4 has an atmospheric inside ambience and the distance between the ceiling and the floor of the load-lock chamber 4 is not less than D1, the first wafer conveying means 51 turns its arm toward the load-lock chamber 4. After checking that the first gate valve 41 is open, it stretches the arm and loads the wafer into the load-lock chamber 4.

Subsequently, the first wafer conveying means 51 moves its arm downwardly. The wafer is moved onto the wafer mounting portion inside the load-lock chamber 4. The arm further moves downwardly and, as the hand disengages from the wafer bottom face and it reaches a position enabling hand retraction, the downward motion is stopped.

Thereafter, the first wafer conveying means 51 draws its arm to retract the hand from the load-lock chamber 4. After the hand is retracted from the load-lock chamber 4, then the load-lock chamber capacity reducing operation is carried out. Namely, while the first gate valve 41 is kept open, the ceiling of the load-lock chamber 4 having a piston-like structure gradually moves downwardly and, when the distance to the floor of the load-lock chamber becomes equal to D2, the motion is stopped.

After changing the load-lock chamber capacity described above, the communication with the atmosphere is intercepted by the first gate valve 41 and, then, the ambience replacement is carried out.

The ambience replacement can be done as follows.

After the gate valve is closed, a vacuum exhaust valve (not shown) is opened and, then, exhausting of the gas inside the load-lock chamber 4 is initiated by use of vacuum exhausting means (not shown). As the gas is exhausted and a predetermined vacuum level is reached, the vacuum exhaust valve 43 is closed and, thus, the exhausting is completed.

Subsequently, He gas the same as the inside ambience gas of the process chamber 1 is supplied into the load-lock chamber 4, by opening a gas supply valve of gas supplying means (not shown). Here, simultaneously with the gas supply, the ceiling of the load-lock chamber 4 is moved upwardly to increase the capacity of the load-lock chamber. The upward motion of the load-lock chamber ceiling continues until the distance between the ceiling and the chamber floor becomes equal to D2 and, at the moment D2 is reached, the upward motion is stopped.

When the capacity of the load-lock chamber is enlarged by moving the chamber ceiling upwardly in a certain ambience different from a vacuum, the gas is cooled by adiabatic expansion. However, since, in this case, the gas supply is carried out concurrently, the gas temperature would not decrease. Hence, the problem of wafer temperature decrease does not occur.

When a reduced pressure He ambience approximately at the same pressure level as that of the process chamber 1 is created inside the load-lock chamber 4, the gas supply valve is closed and the supply of He gas is turned off.

Among the above-described operation, upward motion of the ceiling should desirably be performed and completed before the He gas is supplied to a predetermined pressure.

If the He gas pressure exceeds the predetermined pressure before the distance between the chamber ceiling and the chamber floor reaches D2 and, thus, the He gas supply unit is turned off, the ambience pressure inside the load-lock chamber 4 may desirably be checked after the upward motion of the ceiling is completed and, if it is lower than the predetermined pressure, the He gas may be supplied again.

Subsequently, the pressure is compared between the process chamber 1 and the load-lock chamber 4. If a pressure difference between these chambers is larger than a predetermined value, a pressure correcting operation is carried out. Depending on the apparatus structure, the pressure correcting operation can be performed in various manners.

One example is that a communication pipe is provided between the process chamber 1 and the load-lock chamber 4, and a cutoff valve is provided in a portion of the pipe. When the pressure difference between the process chamber 1 and the load-lock chamber 4 is larger than a predetermined value, the cutoff valve in the communication pipe is opened to provide fluid communication between the process chamber 1 and the load-lock chamber 4. Basically, the pressure difference can be removed by this, and the ambience replacement operation for the load-lock chamber is thus finished.

Another method is that vacuum evacuation or ambience gas supply for the load-lock chamber 4 is carried out again, to produce a predetermined pressure. More specifically, if the pressure of the load-lock chamber 4 is higher than that of the process chamber 1, the vacuum exhaust valve is opened to perform vacuum evacuation. As a predetermined pressure level is reached, the vacuum exhaust valve is closed, and exhausting is stopped. If, on the other hand, the pressure inside the load-lock chamber is lower than the process chamber pressure, the He gas supply valve is opened to supply He gas until a predetermined pressure level is reached. As the pressure difference becomes smaller than the predetermined value as a result of gas exhausting or gas supplying, the ambience replacement operation for the load-lock chamber 4 is completed.

After the ambience replacement of the load-lock chamber 4 is finished, the second gate valve 42 is opened. As the second gate valve 42 is opened and the load-lock chamber 4 is communicated with the process chamber, the second conveying means 52 enters the load-lock chamber 4 to unload the wafer out of the load-lock chamber 4. The second wafer conveying means 52 holds the wafer and conveys it onto a process station, not shown.

At this stage, the wafer temperature has already reached a predetermined temperature. Hence, a subsequent wafer process can be initiated promptly.

It should be noted here that the present invention is not limited to substrate processing apparatuses or substrate conveying methods, as described above. For example, a substrate processing apparatus according to the invention may be one having a first process chamber for performing a process to an object to be processed, in an ambience different from an atmosphere, a second process chamber connected to the first process chamber and the atmosphere, respectively, through an opening/closing mechanism, and conveying means for conveying the object from the atmosphere to the first process chamber through the second process chamber, wherein the capacity of the second process chamber is approximately not greater than ten times the volume of the object.

Furthermore, as describe with reference to some embodiments, the invention is applicable to an exposure apparatus having such a substrate processing apparatus. More specifically, such an exposure apparatus may include a substrate processing apparatus as described and an optical system for directing light from a light source to the object to be processed. More preferably, the apparatus may further comprise an illumination optical system, a reticle stage for supporting a reticle to be illuminated by the illumination optical system, and a projection optical system for projecting light from the reticle to the object to be processed.

Furthermore, the present invention is also applicable to a device manufacturing method that uses an exposure apparatus, such as described above. Preferably, the method may include a step of exposing a substrate to be processed, by use of an exposure apparatus as described above, and a step of developing the exposed substrate.

In accordance with some preferred embodiments of the present invention described hereinbefore, a wafer loaded into a processing apparatus by way of a load-lock chamber has reached a predetermined temperature at the moment the same is loaded. Hence, a subsequent process, such as an exposure process, can be initiated promptly, and the throughput of the apparatus can be improved significantly.

While the invention has been described with reference to the structures disclosed herein, it is not confined to the details set forth and this application is intended to cover such modifications or changes as may come within the purposes of the improvements or the scope of the following claims.

This application claims priority from Japanese Patent Application No. 2003-402488 filed Dec. 2, 2003, which is hereby incorporated by reference.

What is claimed is:

1. A load-lock system, comprising:
a chamber housing; and
a capacity changing system for continuously changing the capacity of said chamber housing.

2. A load-lock system according to claim 1, wherein said capacity changing system includes a driving unit configured and positioned to move a predetermined portion of said chamber housing.

3. A load-lock system according to claim 2, wherein said predetermined portion of said chamber housing includes a table for supporting an object.

4. A load-lock system according to claim 2, further comprising a seal member configured and positioned to seal between said predetermined portion of said chamber housing and another portion of said chamber housing.

5. A load-lock system according to claim 1, further comprising a seal member configured and positioned to seal between a predetermined portion of said chamber housing and another portion of said chamber housing.

6. A load-lock system according to claim 1, further comprising a tubular member provided to reduce a pressure inside said chamber housing.

7. A load-lock system according to claim 6, further comprising a valve through which said tubular member is connected to a main chamber in which an object is to be processed.

8. A load-lock system according to claim 6, further comprising a valve and an exhaust pump, wherein said tubular member is connected to said exhaust pump through said valve.

9. A device manufacturing apparatus comprising:
a load-lock system as recited in claim 1.

10. An exposure apparatus for exposing an object to a pattern radiation, said apparatus comprising:
a load-lock system as recited in claim 1.

11. A device manufacturing method, comprising the steps of:
exposing an object to pattern radiation by use of an exposure apparatus as recited in claim 10; and
developing the exposed object.

12. A load-lock method, comprising the steps of:
conveying an object into a chamber housing;
continuously reducing the capacity of the chamber housing after said conveying step; and
reducing the pressure inside the chamber housing after said capacity reducing step.

13. A method according to claim 12, wherein in said capacity reducing step, a predetermined portion of the chamber housing is moved.

14. A method according to claim 13, wherein the predetermined portion of the chamber housing includes a table for supporting the object.

15. A method according to claim 13, wherein an interface between the predetermined portion of the chamber housing and another portion of the chamber housing is sealed.

16. A method according to claim 13, wherein, in said pressure reducing step, the pressure is reduced by use of a tubular member.

17. A method according to claim 16, wherein for the pressure reduction, the tubular member is connected to a main chamber in which the object is to be processed.

18. A method according to claim 16, wherein for the pressure reduction, the tubular member is connected to an exhaust pump.

* * * * *